United States Patent
Hayashi et al.

(10) Patent No.: US 9,425,709 B2
(45) Date of Patent: Aug. 23, 2016

(54) VIBRATION DRIVEN POWER GENERATION ELEMENT AND METHOD OF MANUFACTURE THEREOF

(71) Applicant: AOI Electronics Co., Ltd., Takamatsu-shi, Kagawa (JP)

(72) Inventors: Hiroki Hayashi, Takamatsu (JP); Masato Suzuki, Takamatsu (JP); Takashi Konno, Takamatsu (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 458 days.

(21) Appl. No.: 13/772,804

(22) Filed: Feb. 21, 2013

(65) Prior Publication Data

US 2013/0229087 A1 Sep. 5, 2013

(30) Foreign Application Priority Data

Feb. 22, 2012 (JP) ................................. 2012-036247

(51) Int. Cl.
  *H01L 29/84* (2006.01)
  *H02N 1/08* (2006.01)
(52) U.S. Cl.
  CPC . *H02N 1/08* (2013.01); *H01L 29/84* (2013.01)
(58) Field of Classification Search
  CPC .................................. H01L 29/84; H02N 1/08
  USPC ............................................... 438/50, 51, 52
  IPC .................................... H01L 29/84; H02N 1/08
  See application file for complete search history.

(56) References Cited

U.S. PATENT DOCUMENTS

| | | | | |
|---|---|---|---|---|
| 6,227,050 B1* | 5/2001 | Fujii | ..................... | B81B 7/0006 361/283.3 |
| 6,621,191 B1* | 9/2003 | Nomura | ................. | H02N 1/004 251/129.01 |
| 2004/0232502 A1* | 11/2004 | Hsieh | ..................... | H02N 1/008 257/415 |
| 2005/0002079 A1* | 1/2005 | Novotny | ............. | B81C 1/00246 359/245 |
| 2005/0258709 A1* | 11/2005 | Furusho | ................. | H02N 1/004 310/309 |
| 2008/0314869 A1* | 12/2008 | Novotny | ............ | G02B 26/0841 216/24 |

(Continued)

FOREIGN PATENT DOCUMENTS

| | | |
|---|---|---|
| JP | 63-287012 A | 11/1988 |
| JP | 5-308784 A | 11/1993 |

(Continued)

OTHER PUBLICATIONS

McConnell et al, "Thermal Conductivity of Doped Polysilicon Layers", Journal of Microelectromechanical Systems, vol. 10, No. 3, Sep. 2001.*

(Continued)

*Primary Examiner* — John K Kim
(74) *Attorney, Agent, or Firm* — Crowell & Moring LLP

(57) ABSTRACT

A vibration driven power generation element according to the present invention includes: a three dimensionally shaped movable comb tooth electrode comprising a plurality of comb teeth of which interiors are filled with an insulating material, and having an $SiO_2$ layer into which alkali ions are injected provided upon its outer surface; and a fixed type comb tooth electrode provided with a plurality of comb teeth made from Si the interiors of which are doped so as to have low electrical resistance, being arranged with the three dimensionally shaped movable comb tooth electrode opposed thereto and interleaved thereinto.

22 Claims, 37 Drawing Sheets

(56) References Cited

U.S. PATENT DOCUMENTS

| | | |
|---|---|---|
| 2011/0109195 A1 | 5/2011 | Nakatsuka et al. |
| 2012/0169179 A1 | 7/2012 | Masaki et al. |
| 2012/0267241 A1* | 10/2012 | Fredenberg ......... B81C 99/0085 204/267 |
| 2013/0229087 A1* | 9/2013 | Hayashi et al. ............... 310/300 |

FOREIGN PATENT DOCUMENTS

| | | |
|---|---|---|
| JP | 2010-11547 A | 1/2010 |
| JP | 2010-68643 A | 3/2010 |
| JP | 2010-136598 A | 6/2010 |
| JP | 2011-72070 A | 4/2011 |
| WO | WO 2010/035507 A1 | 4/2010 |

OTHER PUBLICATIONS

Honzumi et al. (Honzumi, M., Ueno, A., Hagiwara, K., Suzuki, Y., Tajima, T., and Kasagi, N.) "Soft-X-Ray-Charged Vertical Electrets and Its Application to Electrostatic Transducers", Proc. 23rd IEEE Int. Conf. MEMS, Hong Kong, China, Jan. 24-28, 2010, pp. 635-638.

* cited by examiner

FIG. 1A
COMB TOOTH ELECTRODE CONSTRUCTION 1
PROCESS #1-1: SOI WAFER PREPARATION
a) WAFER TOP VIEW
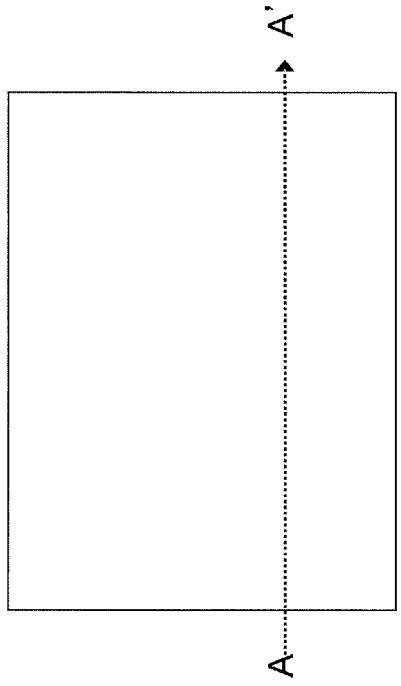
WAFER UPPER SURFACE
b) WAFER SECTIONAL VIEW
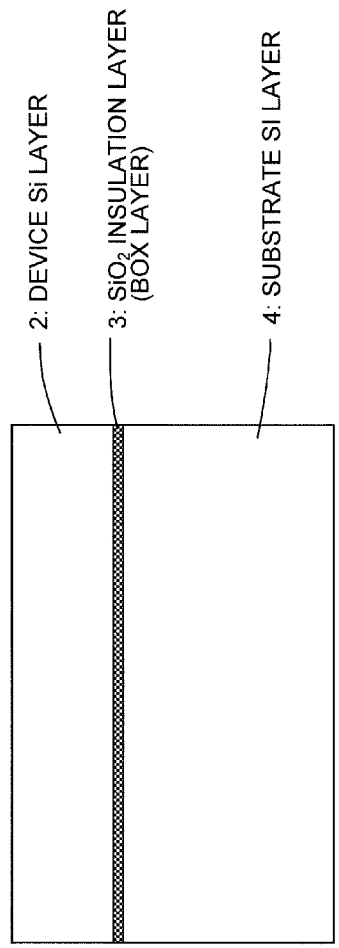
A-A' CROSS SECTION
2: DEVICE Si LAYER
3: SiO$_2$ INSULATION LAYER (BOX LAYER)
4: SUBSTRATE Si LAYER

FIG.1B
COMB TOOTH ELECTRODE CONSTRUCTION 1
PROCESS #1-2: $SiN_x$ LAYER FORMATION
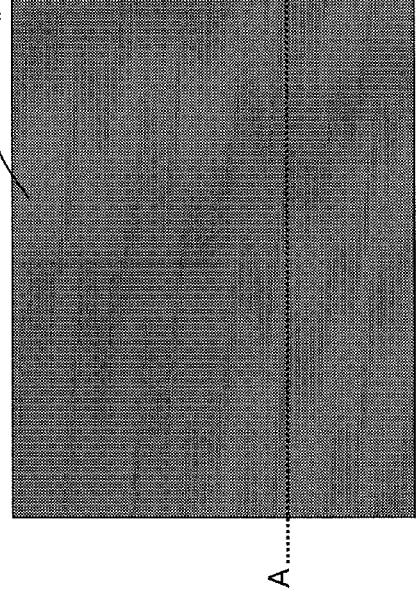
a) WAFER TOP VIEW
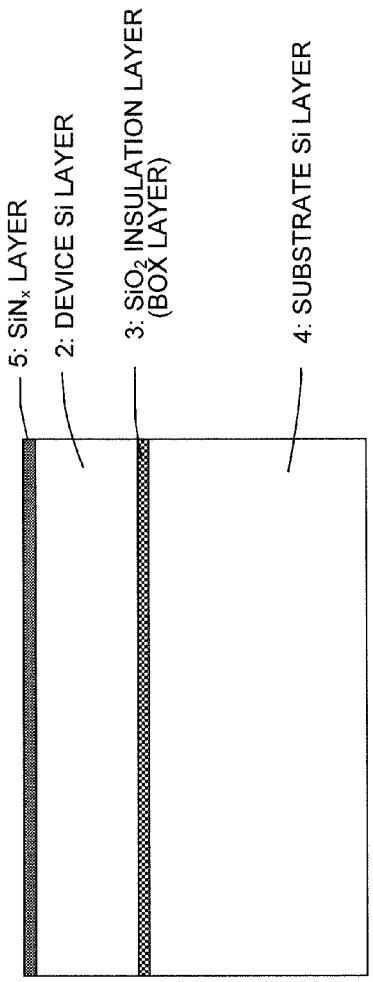
b) WAFER SECTIONAL VIEW
- 5: $SiN_x$ LAYER
- 2: DEVICE Si LAYER
- 3: $SiO_2$ INSULATION LAYER (BOX LAYER)
- 4: SUBSTRATE Si LAYER

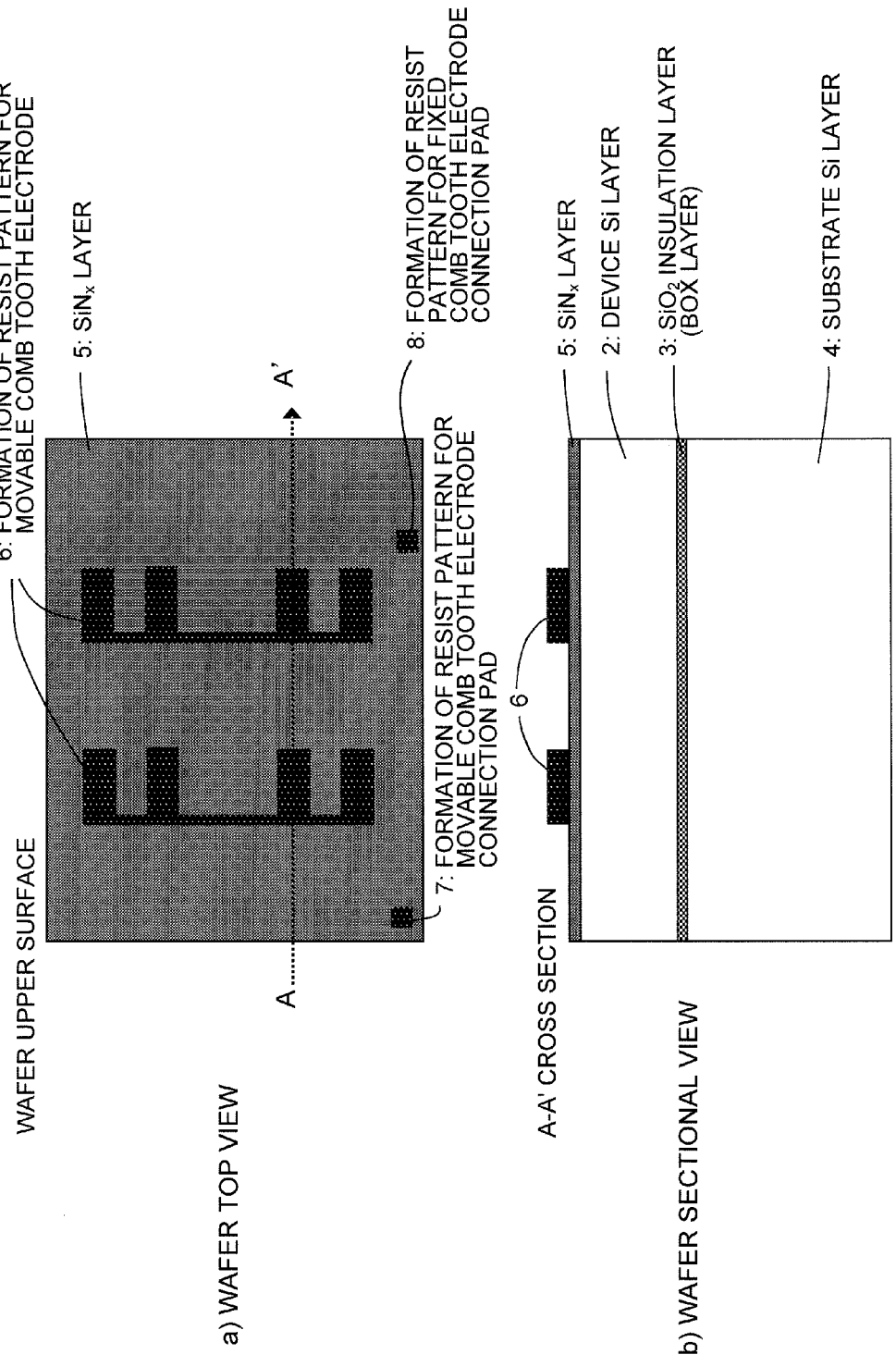

FIG.1D
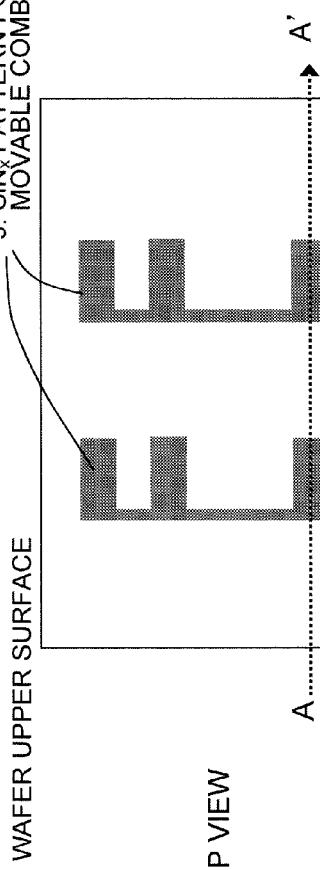
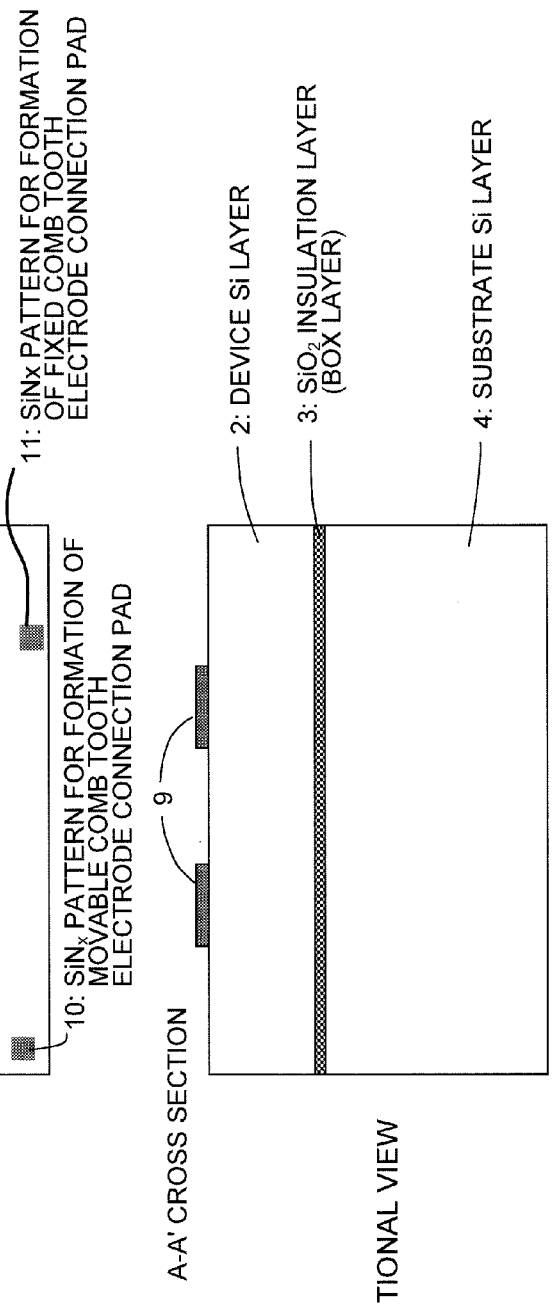

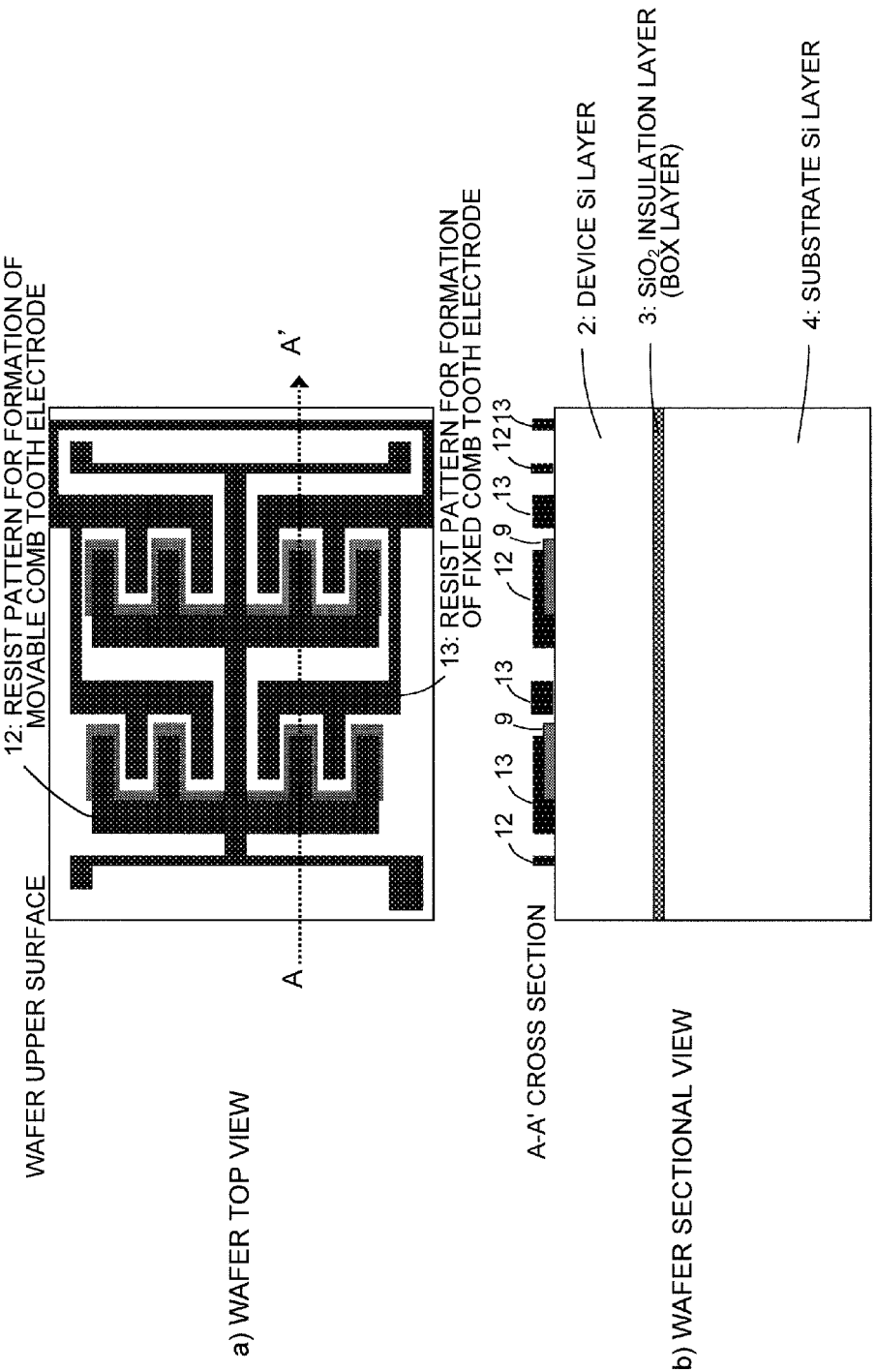

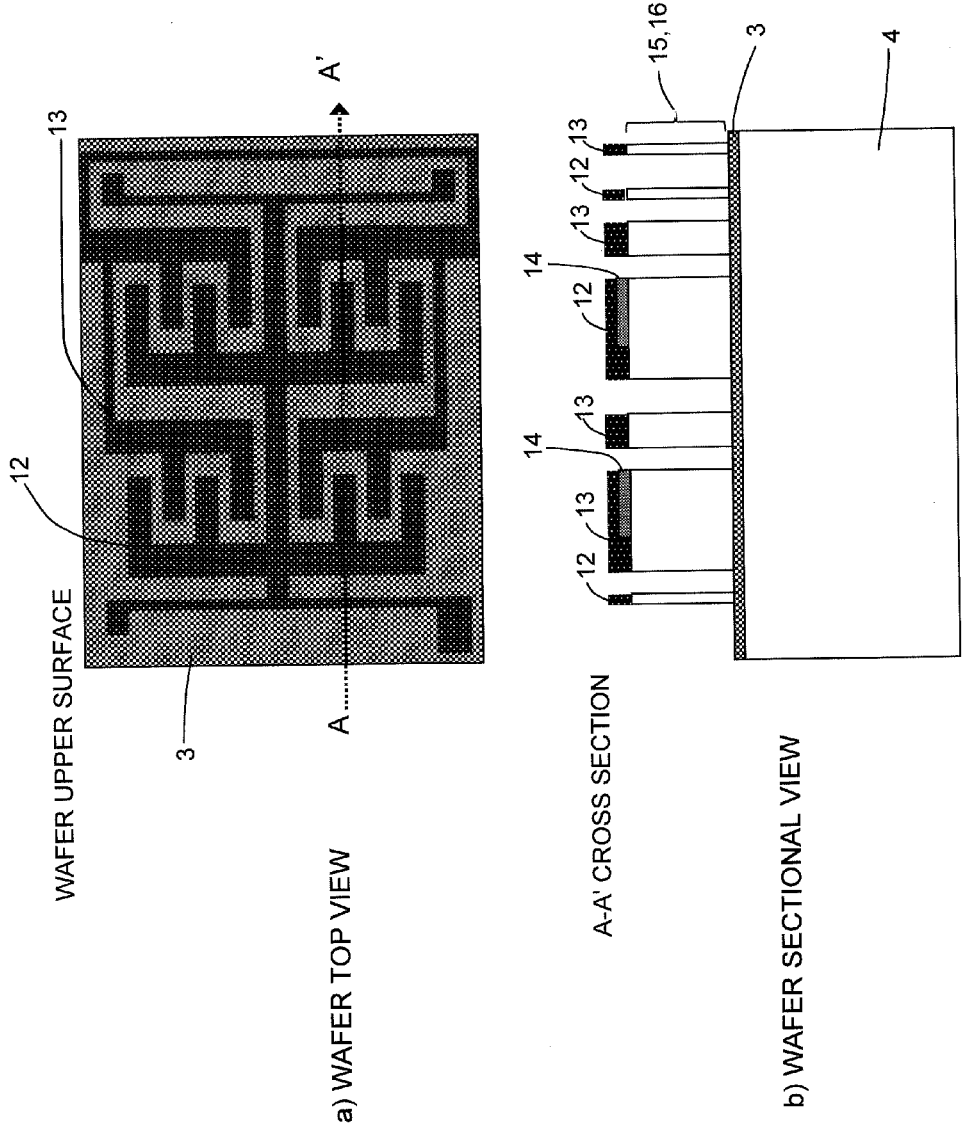

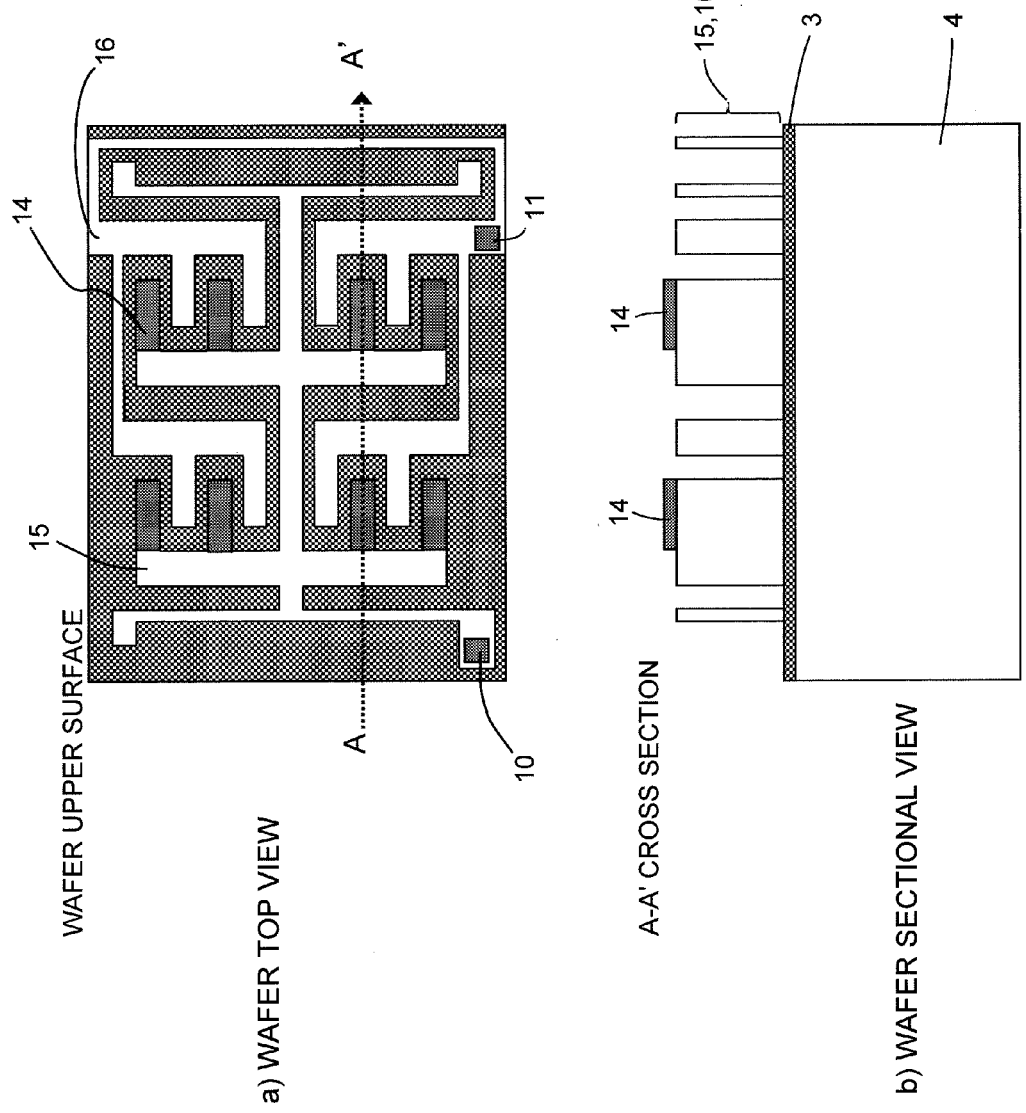

FIG. 1H
COMB TOOTH ELECTRODE CONSTRUCTION 1
PROCESS #1-8: PROTECTIVE LAYER FORMATION
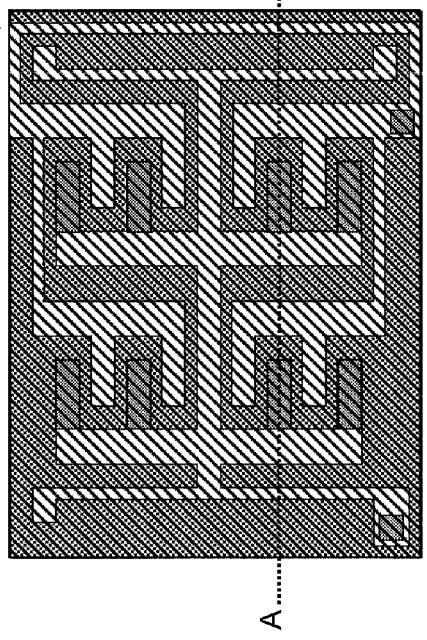
a) WAFER TOP VIEW
WAFER UPPER SURFACE
(ALUMINUM LAYER FORMATION OVER ENTIRE SURFACE)
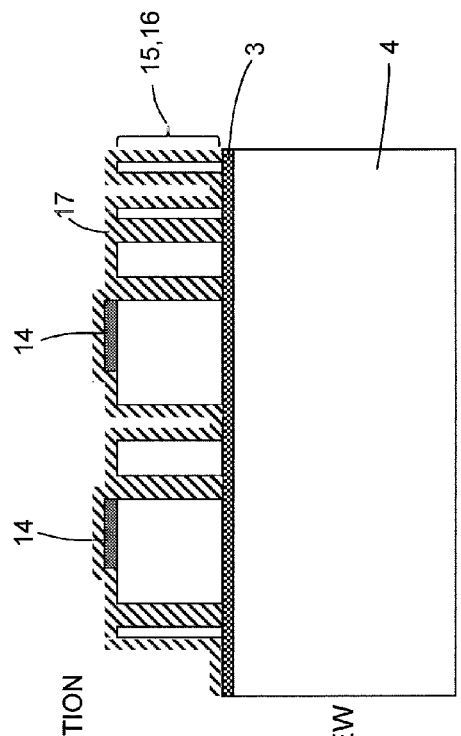
A-A' CROSS SECTION
b) WAFER SECTIONAL VIEW

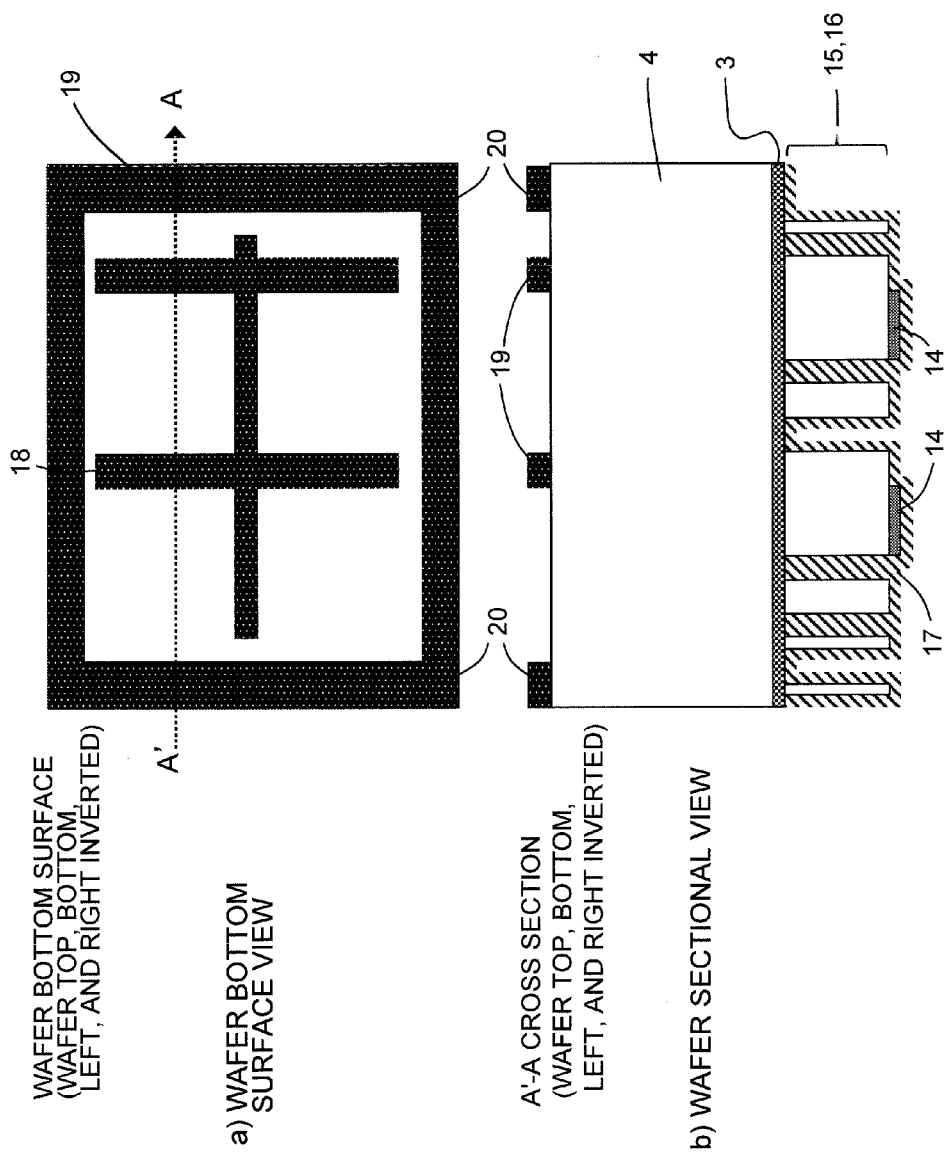

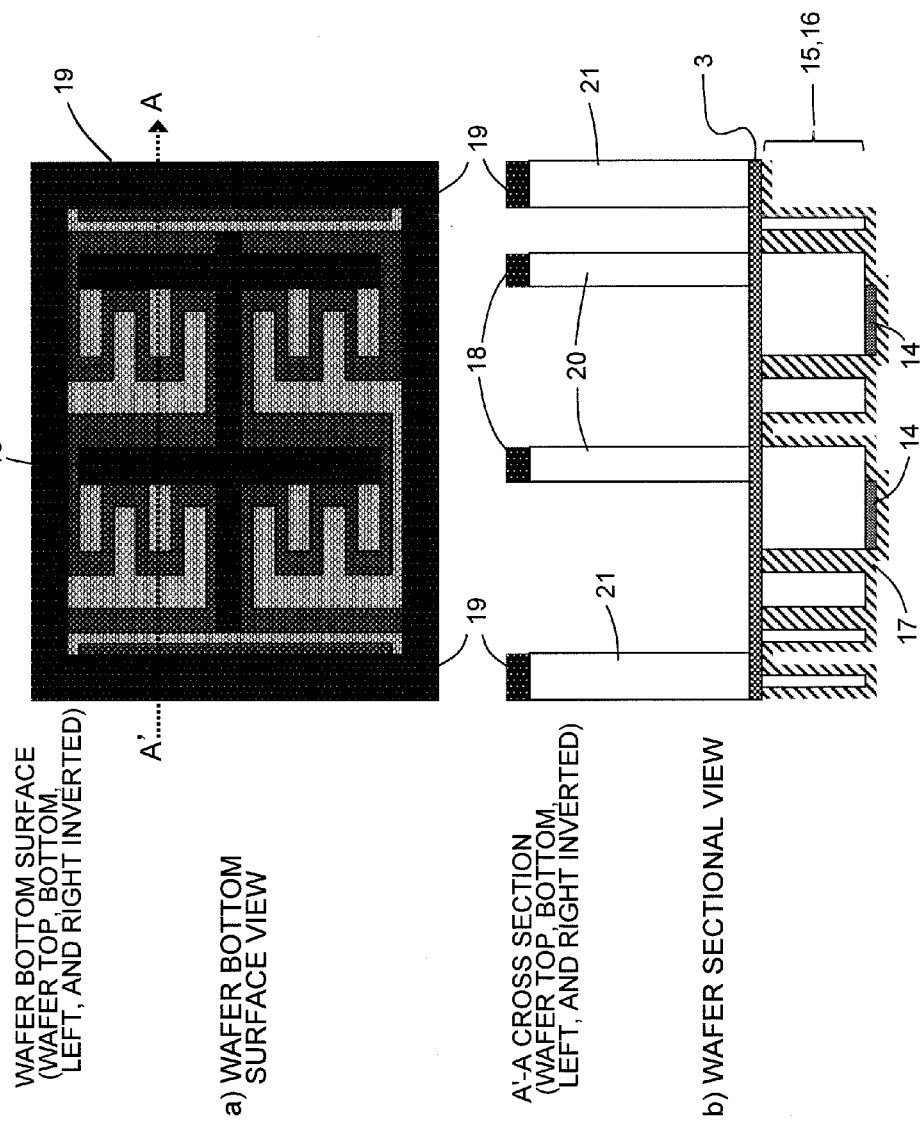

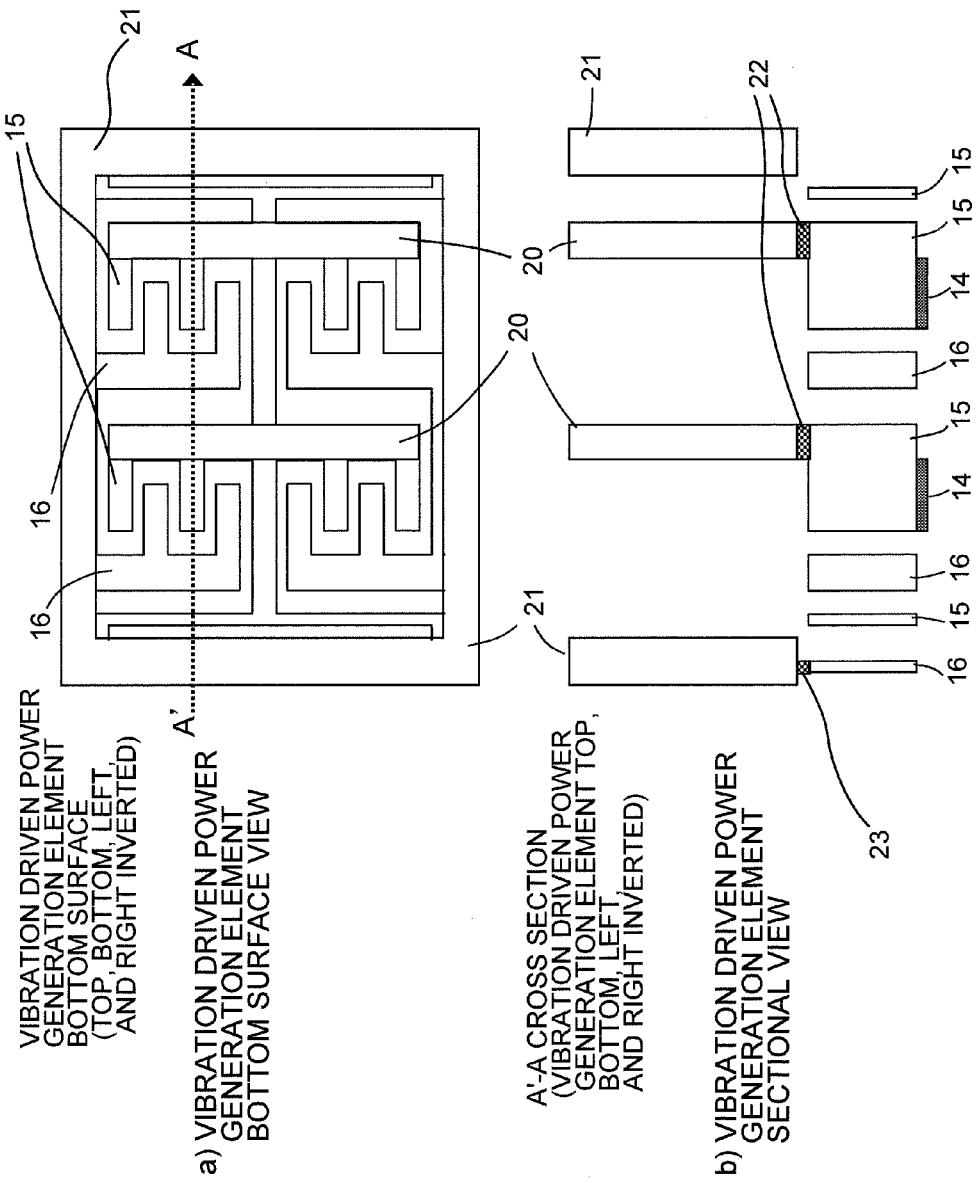

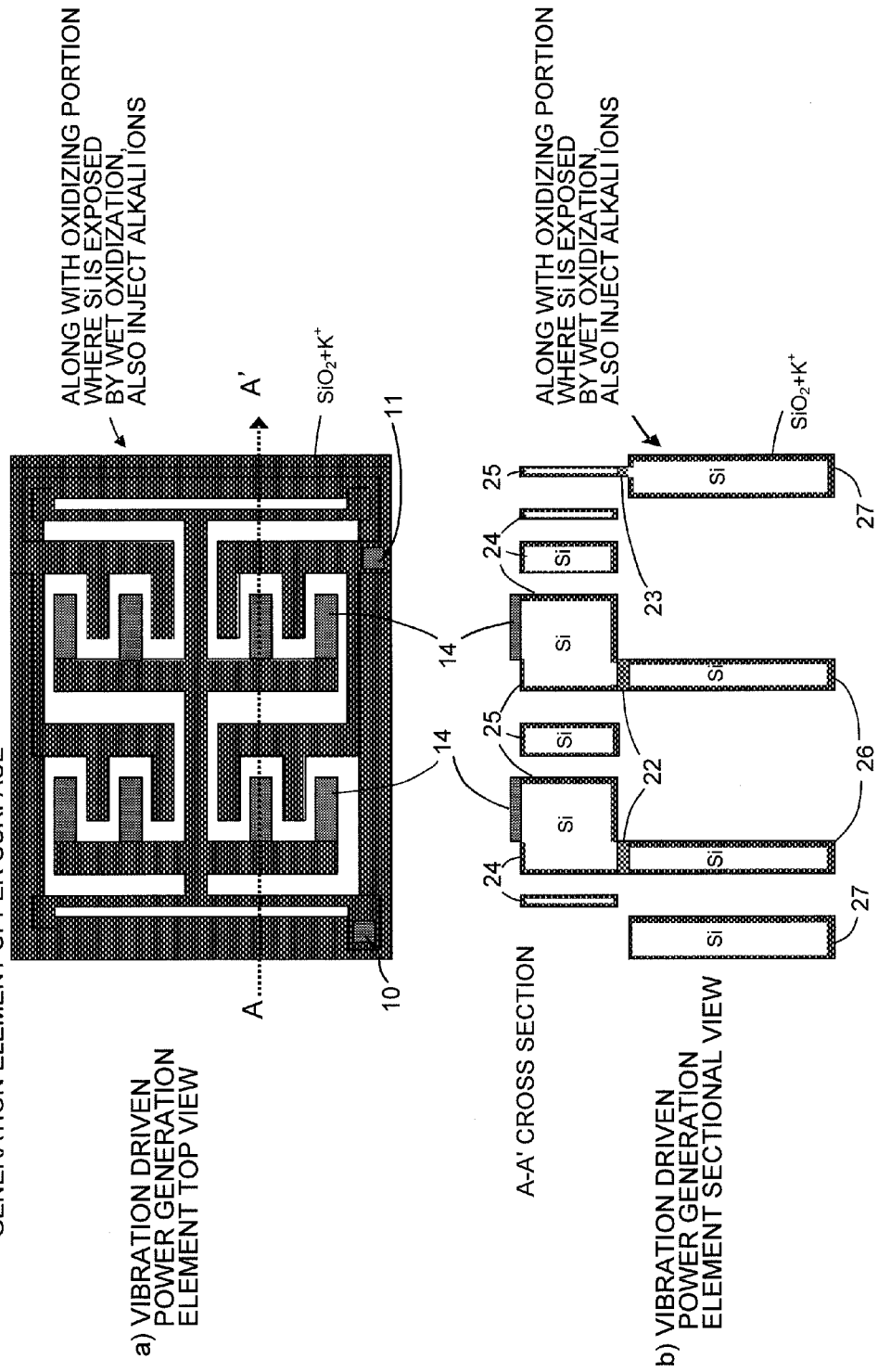

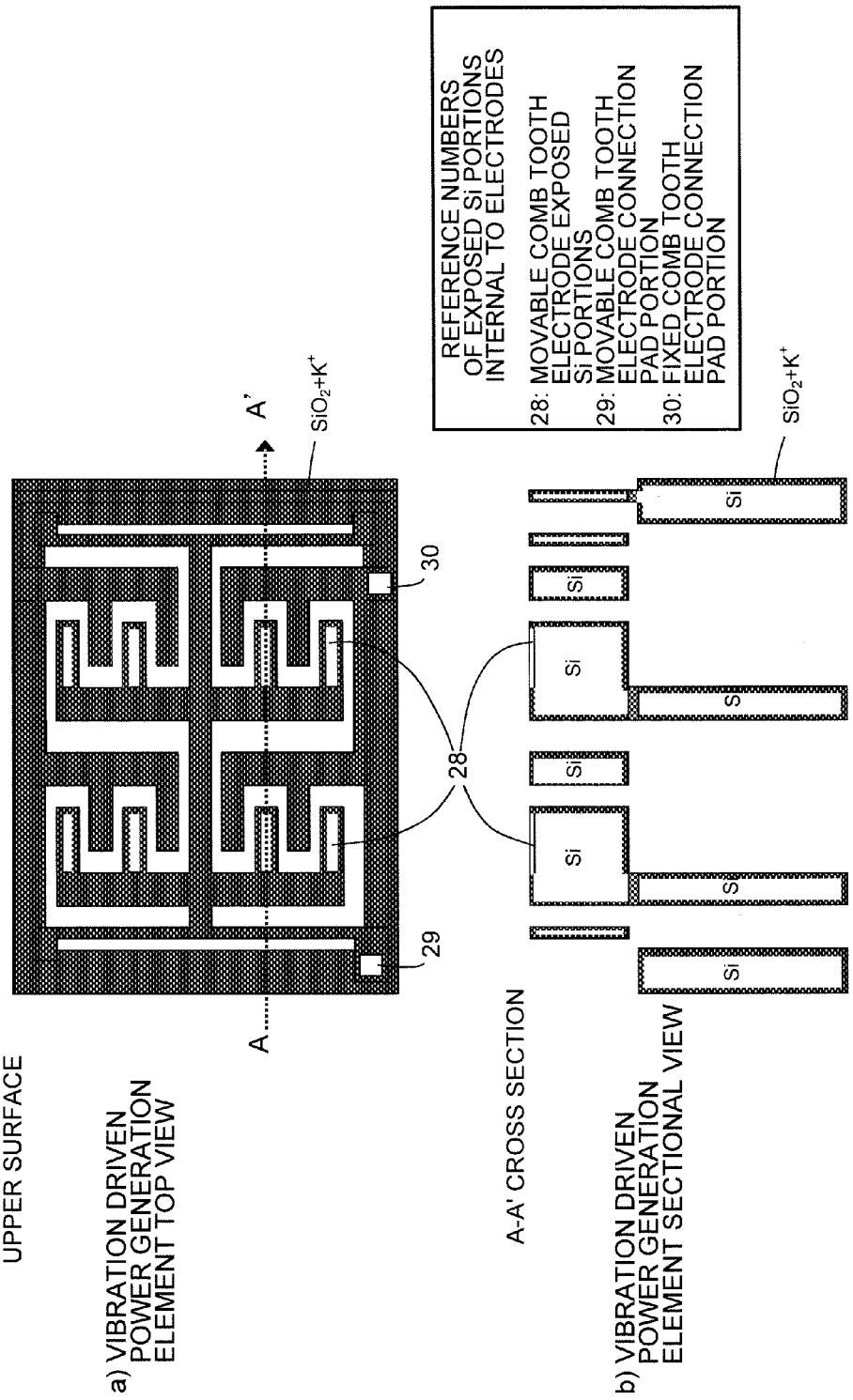

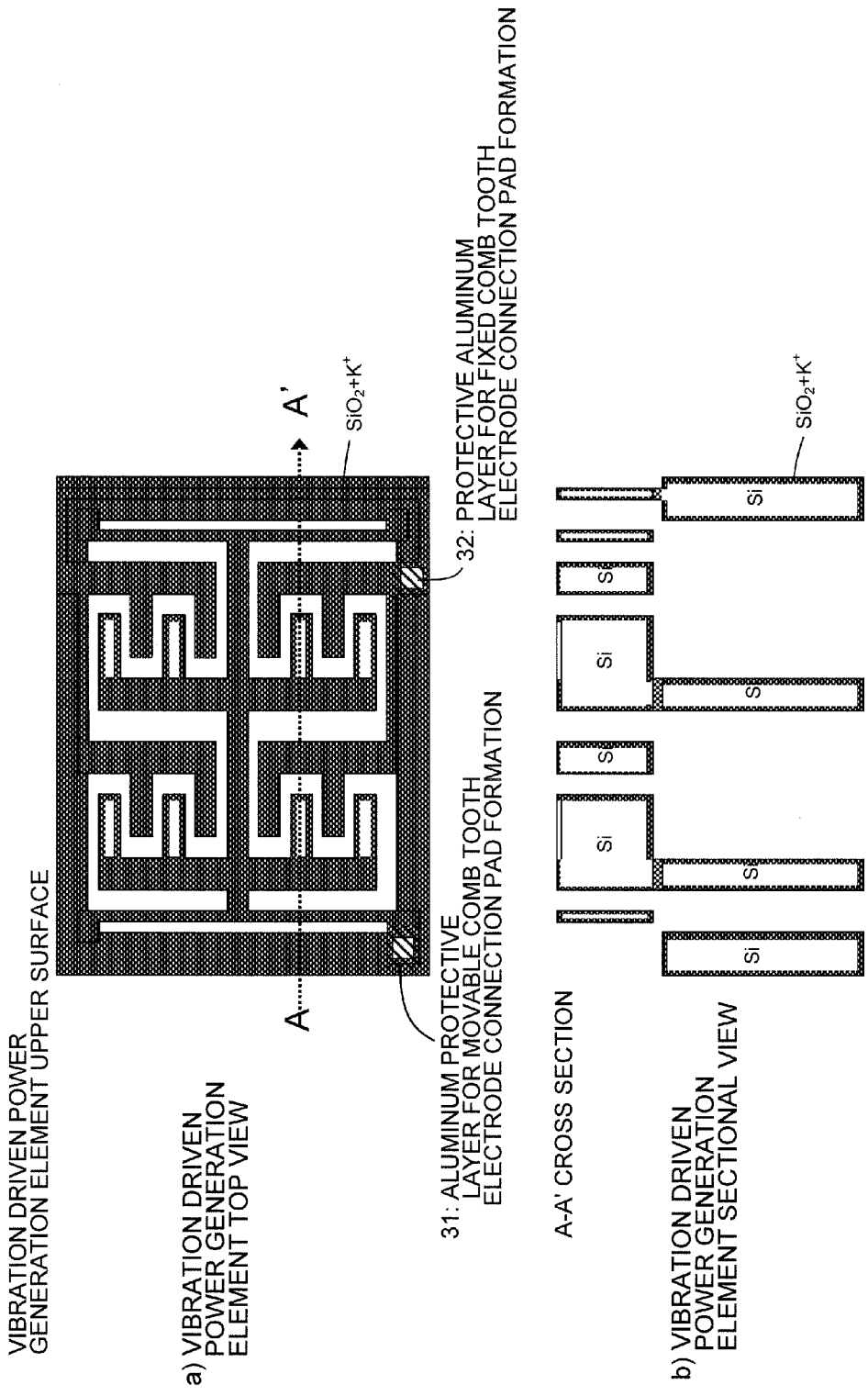

FIG.1P COMB-TOOTH ELECTRODE CONSTRUCTION 1
PROCESS #1-16: ELECTRODE CONNECTION PAD FORMATION #2
(FORMATION OF OHMIC CONTACTS)
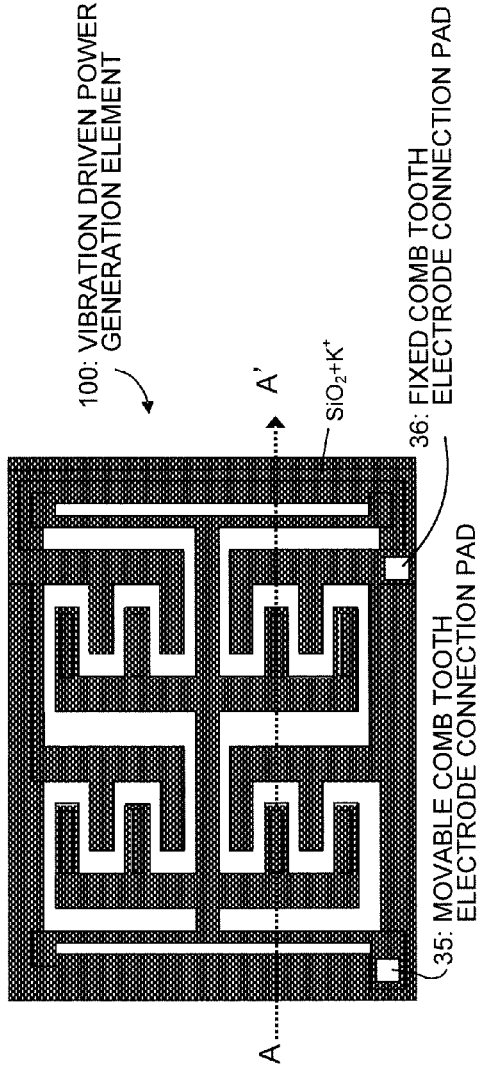
a) VIBRATION DRIVEN POWER GENERATION ELEMENT TOP VIEW
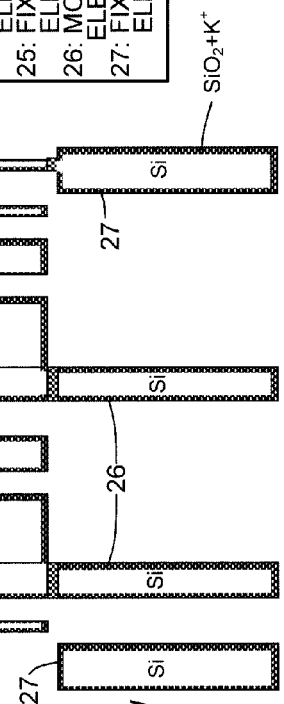
b) VIBRATION DRIVEN POWER GENERATION ELEMENT SECTIONAL VIEW

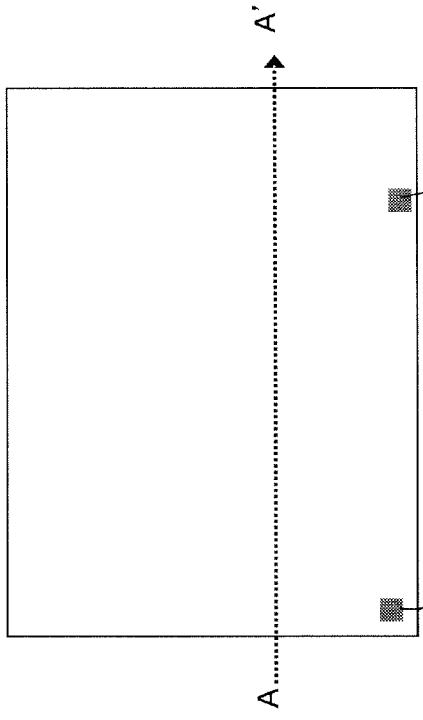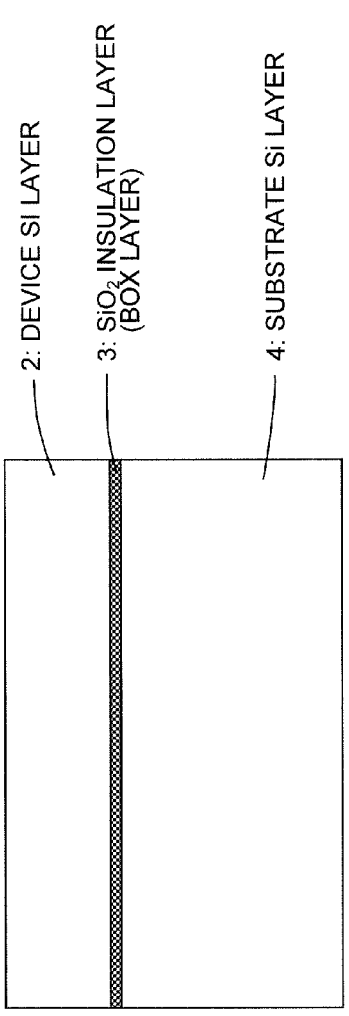
FIG. 3B COMB TOOTH ELECTRODE CONSTRUCTION 2
PROCESS #2-4: REMOVAL OF $SiN_x$ AND RESIST

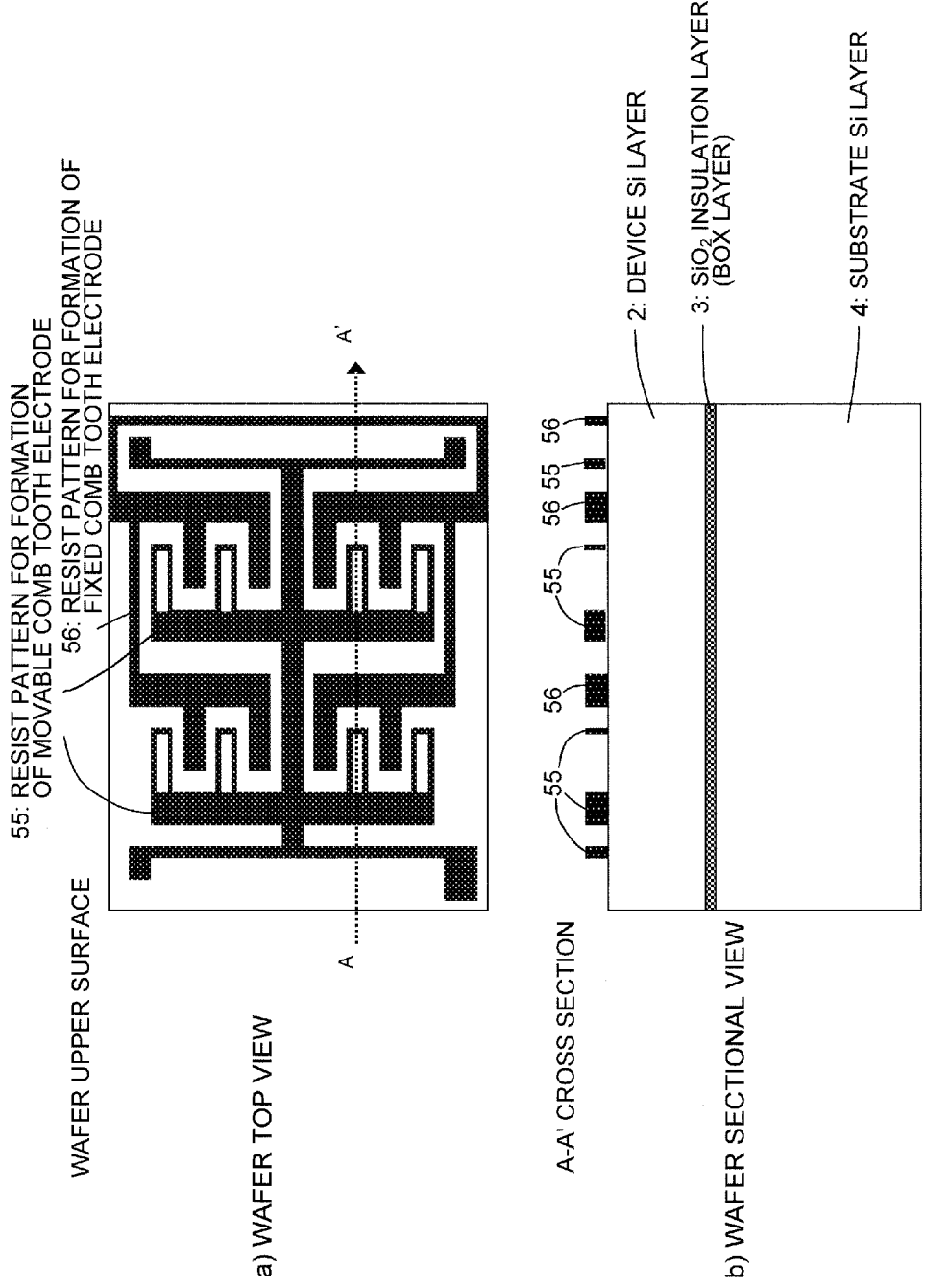

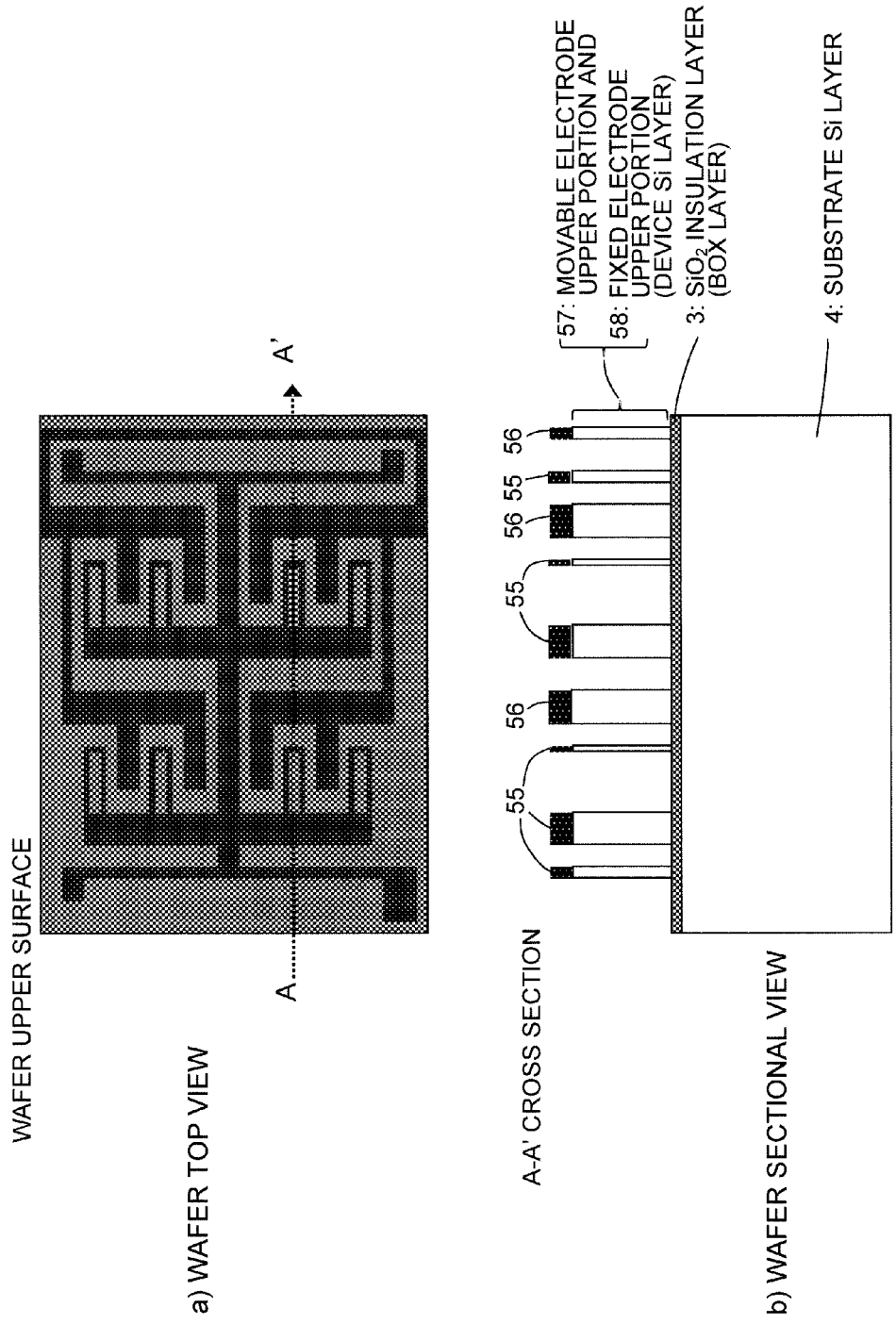

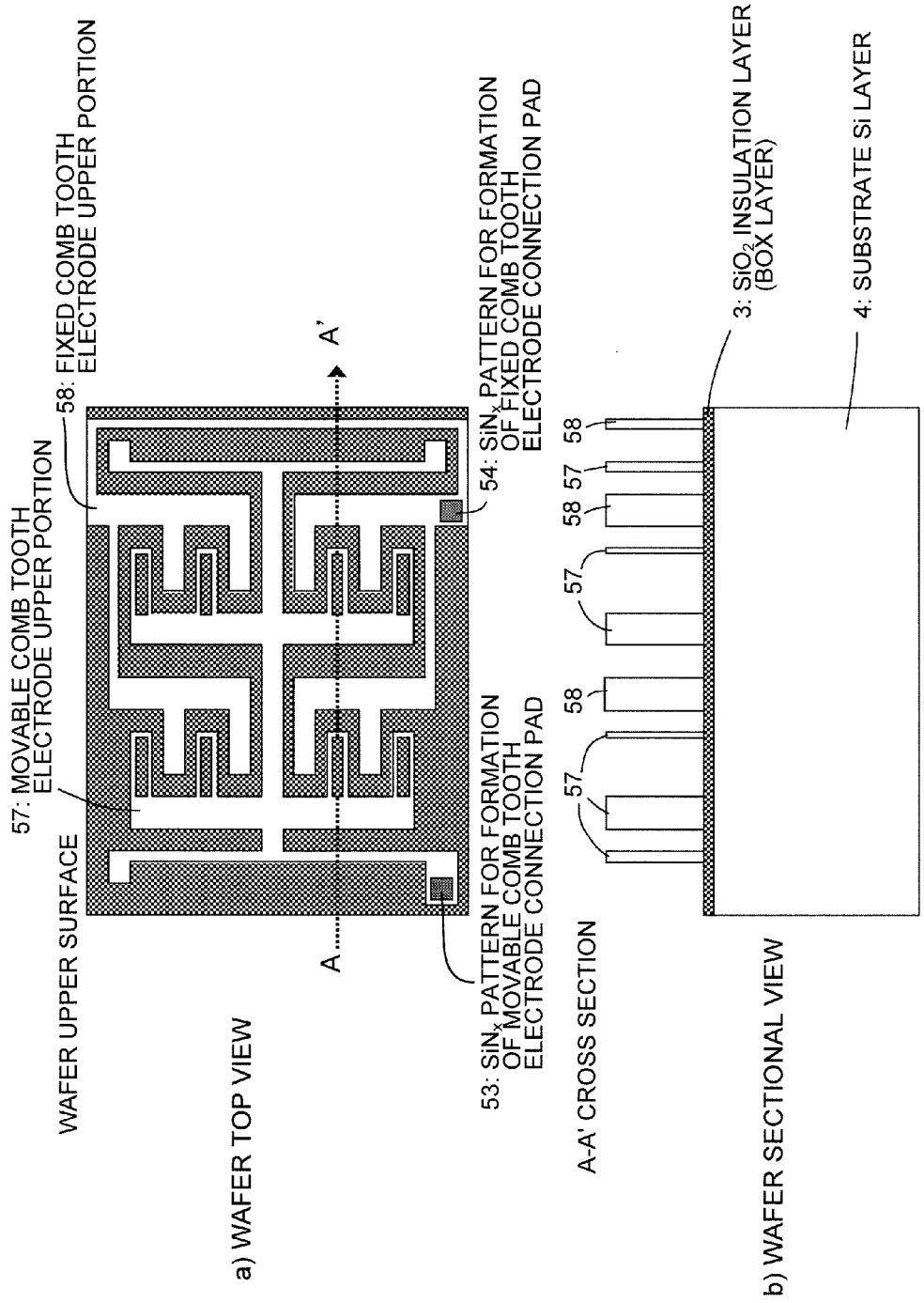

FIG.3F COMB TOOTH ELECTRODE CONSTRUCTION 2
PROCESS #2-8: PROTECTIVE LAYER FORMATION
WAFER UPPER SURFACE
(ALUMINUM LAYER FORMATION OVER ENTIRE SURFACE)
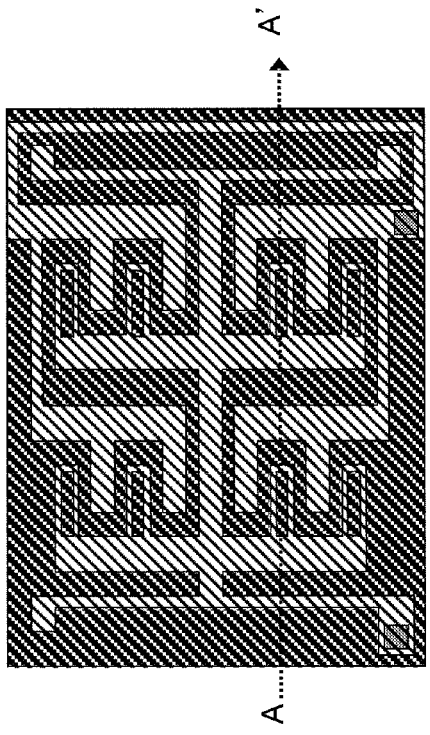
a) WAFER TOP VIEW
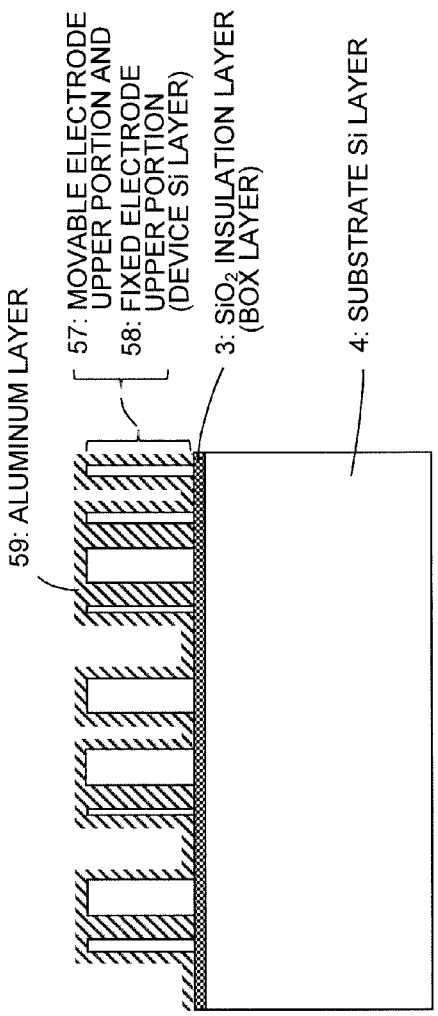
59: ALUMINUM LAYER
57: MOVABLE ELECTRODE UPPER PORTION AND
58: FIXED ELECTRODE UPPER PORTION (DEVICE Si LAYER)
3: SiO₂ INSULATION LAYER (BOX LAYER)
4: SUBSTRATE Si LAYER
A-A' CROSS SECTION
b) WAFER SECTIONAL VIEW

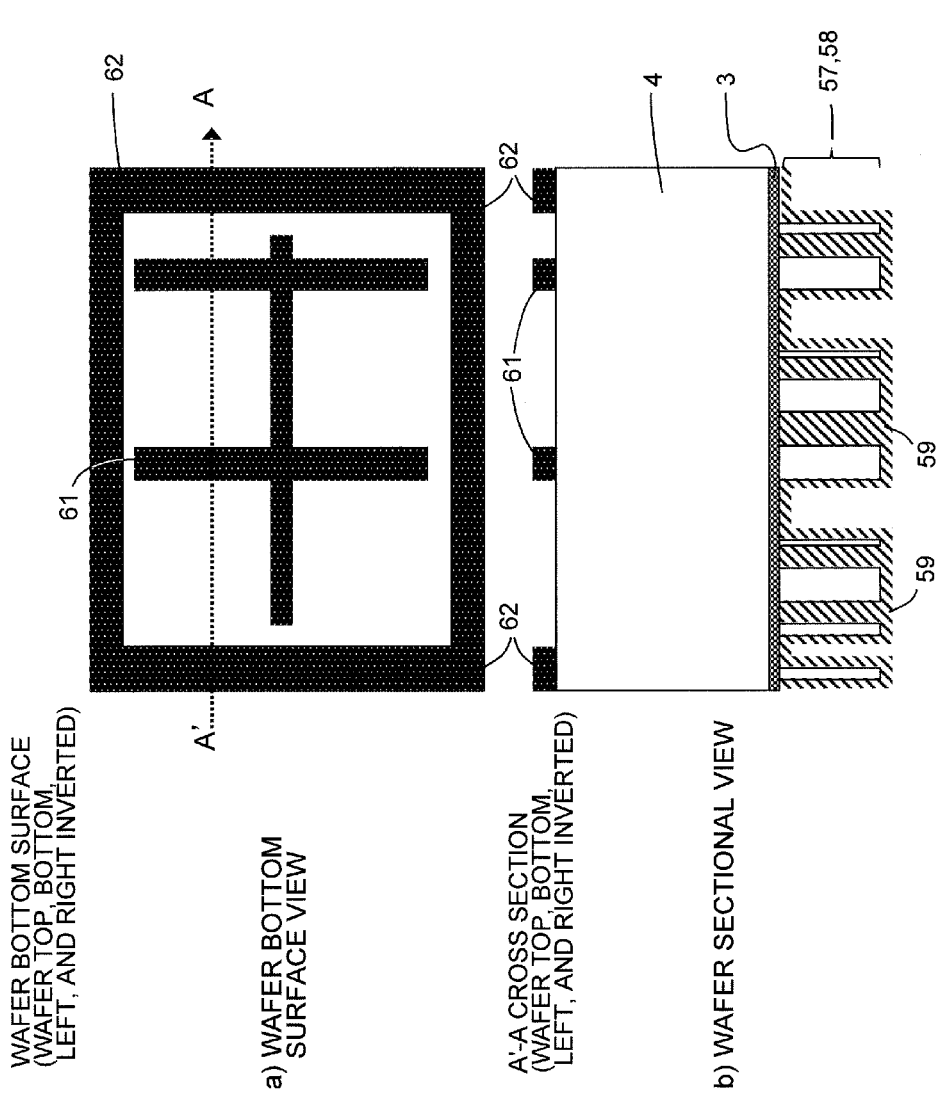

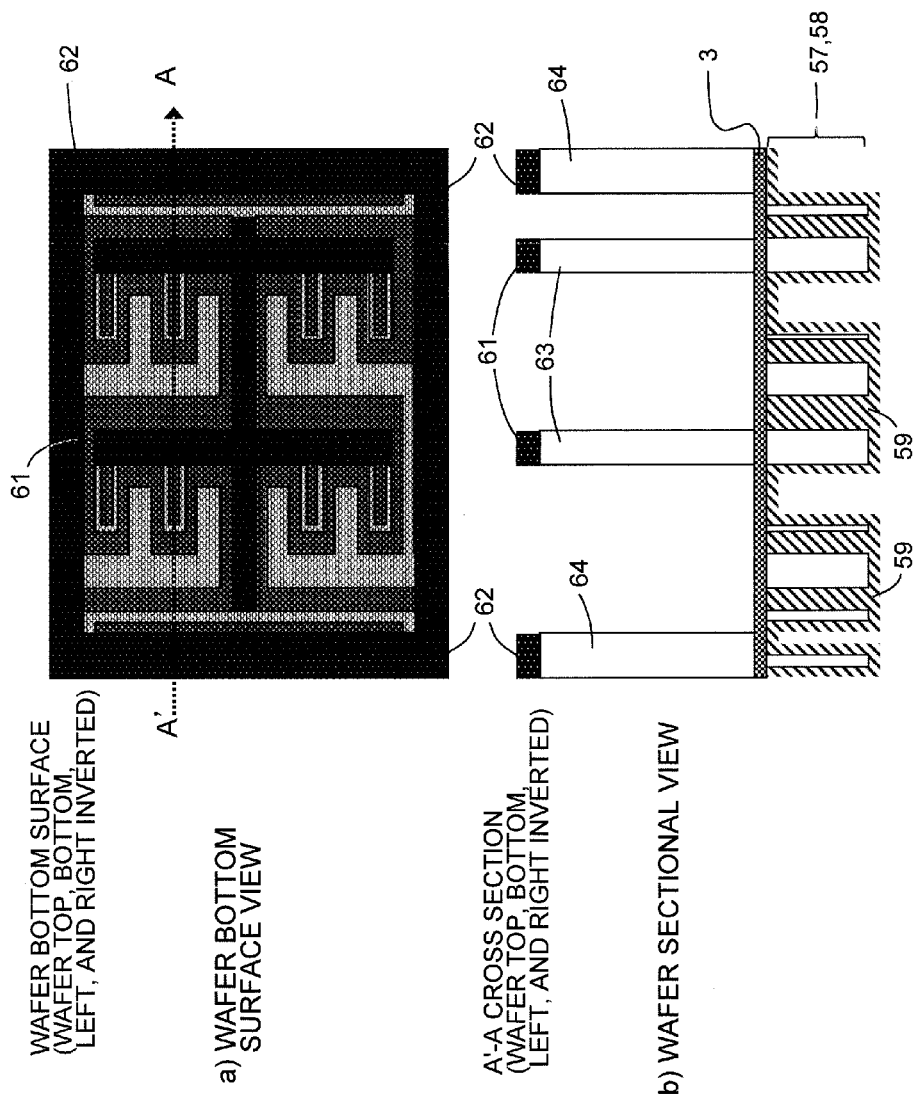
FIG. 3H COMB TOOTH ELECTRODE CONSTRUCTION 2
PROCESS #2-10: REAR SURFACE PROCESSING (ICP RIE)

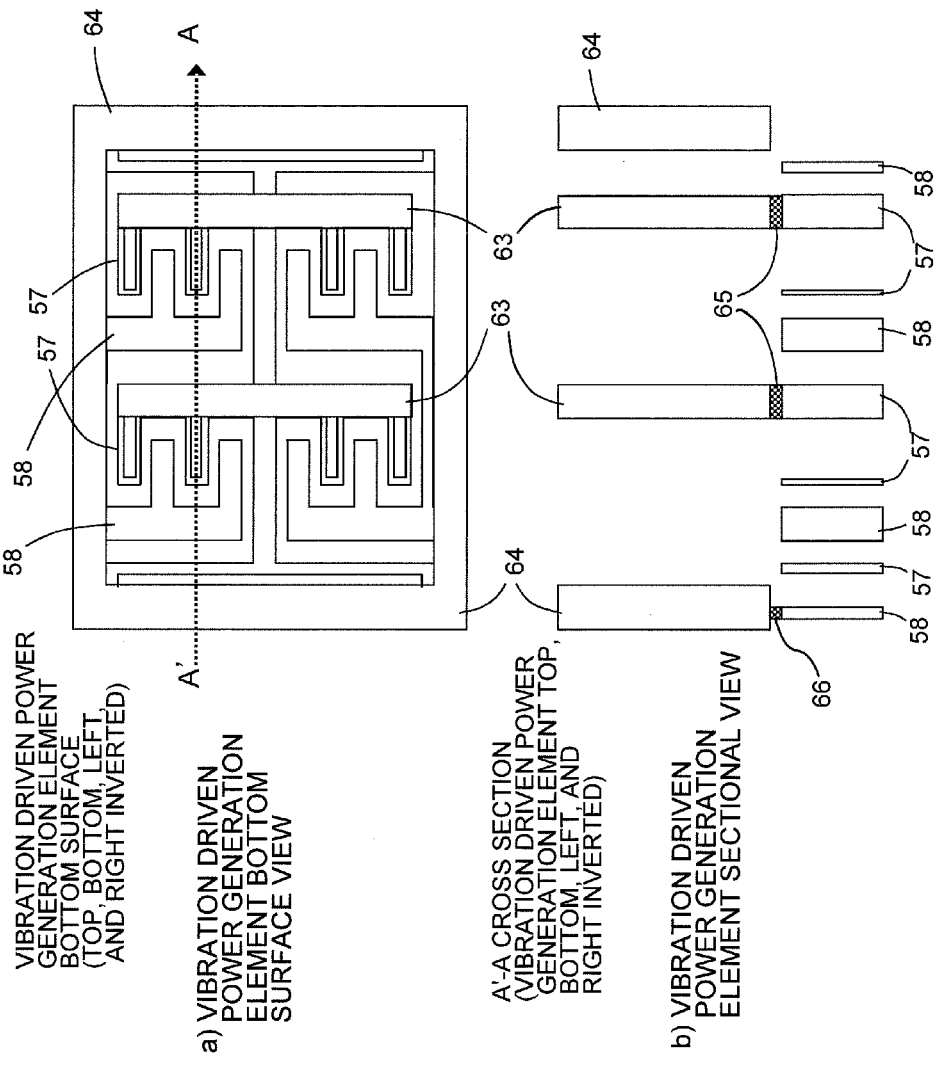

FIG. 3J COMB TOOTH ELECTRODE CONSTRUCTION 2
PROCESS #2-12: Si SURFACE THERMAL OXIDIZATION + ALKALI ION IMPLANTATION
(WET OXIDIZATION)
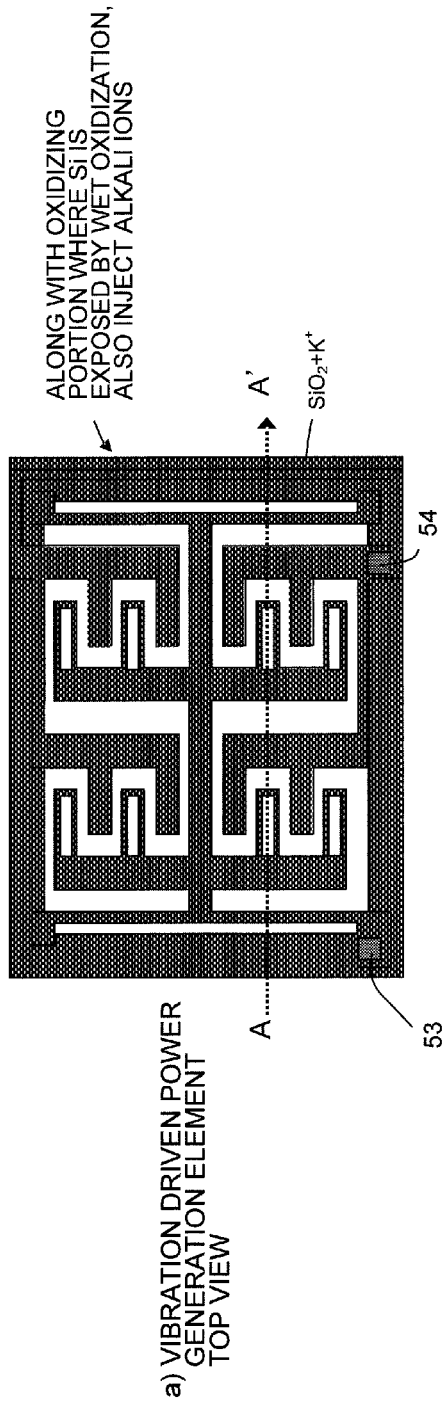
a) VIBRATION DRIVEN POWER GENERATION ELEMENT TOP VIEW
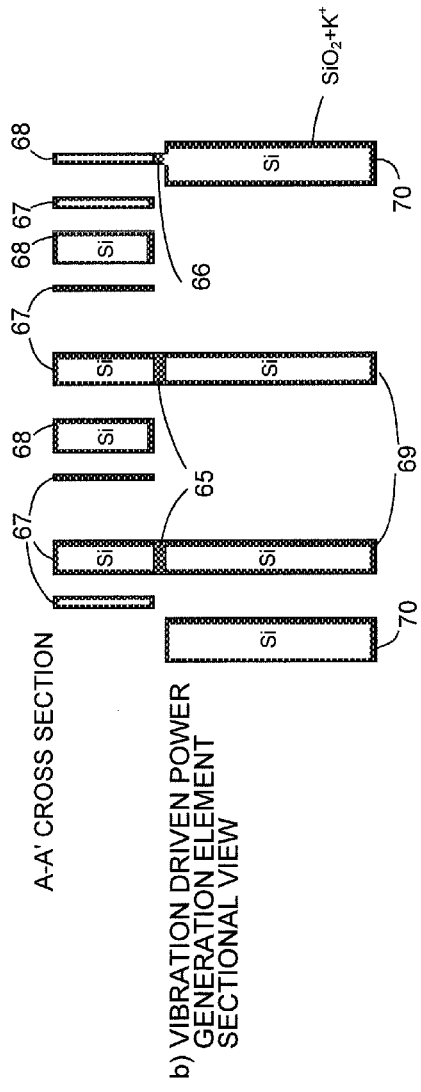
b) VIBRATION DRIVEN POWER GENERATION ELEMENT SECTIONAL VIEW

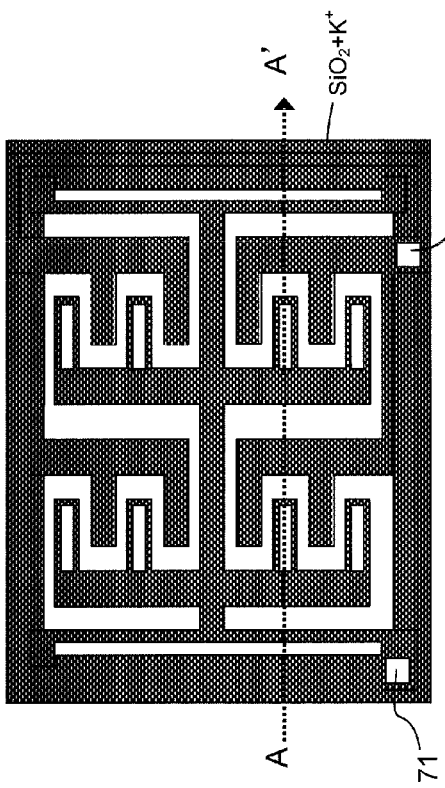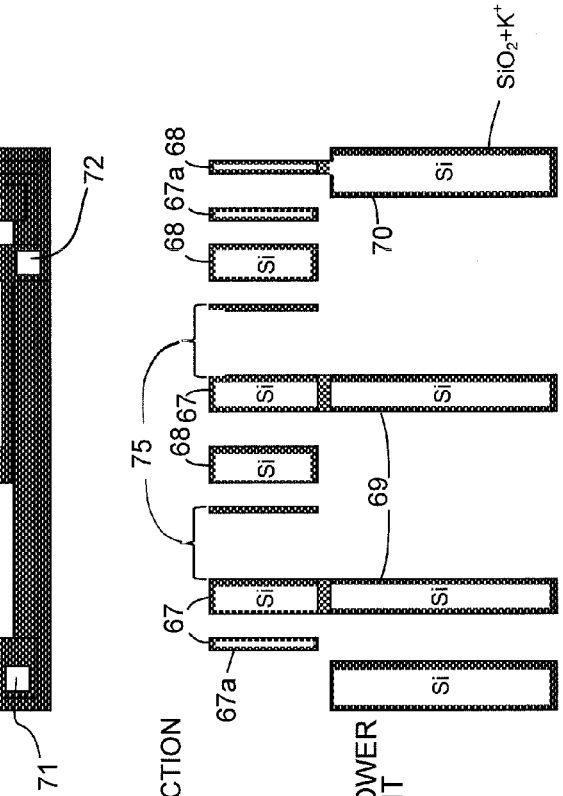
FIG.3K  COMB TOOTH ELECTRODE CONSTRUCTION 2
PROCESS #2-13: REMOVAL OF SiN$_x$ ON ELECTRODE CONNECTION PAD PORTIONS
a) VIBRATION DRIVEN POWER GENERATION ELEMENT TOP VIEW
b) VIBRATION DRIVEN POWER GENERATION ELEMENT SECTIONAL VIEW

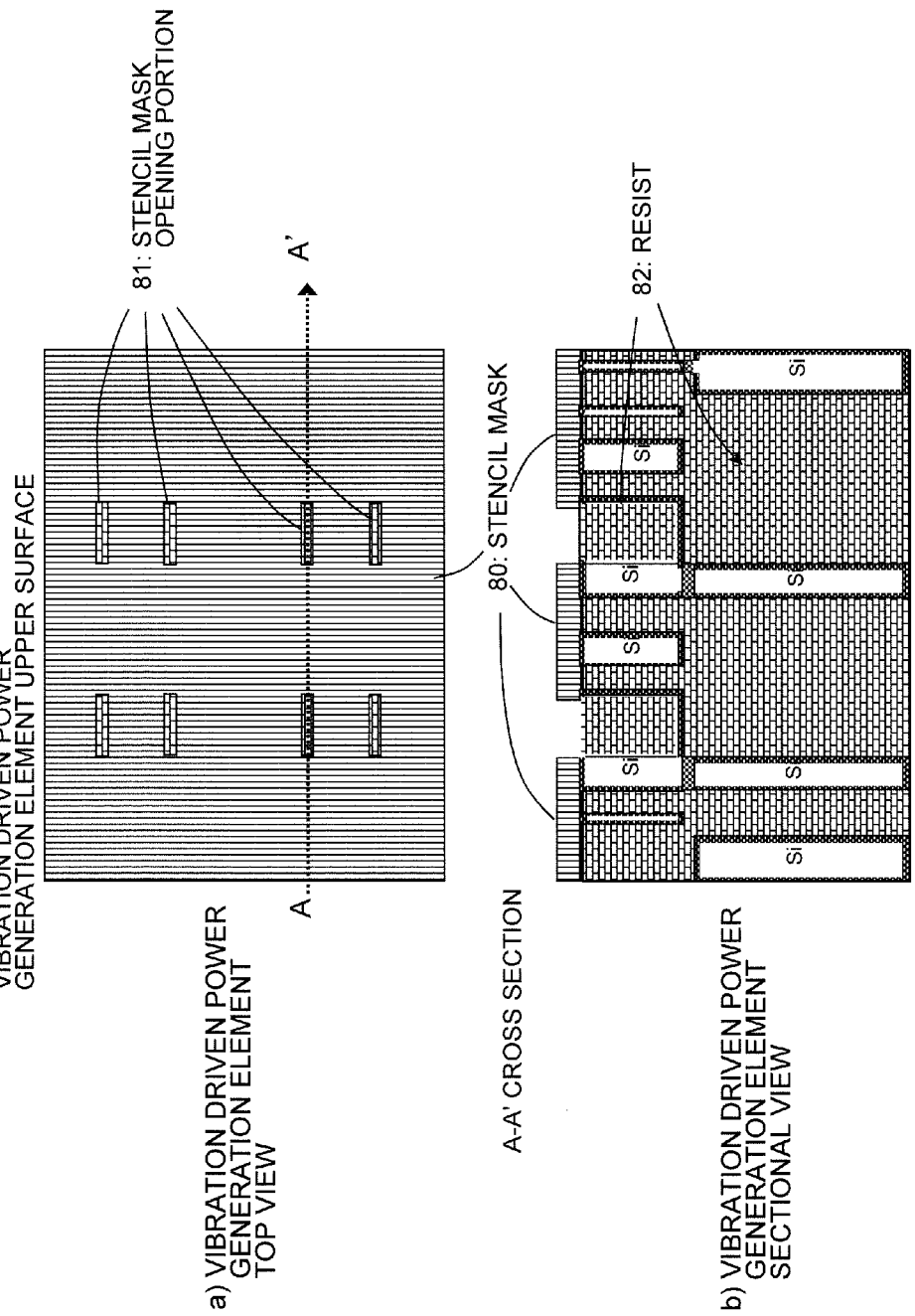

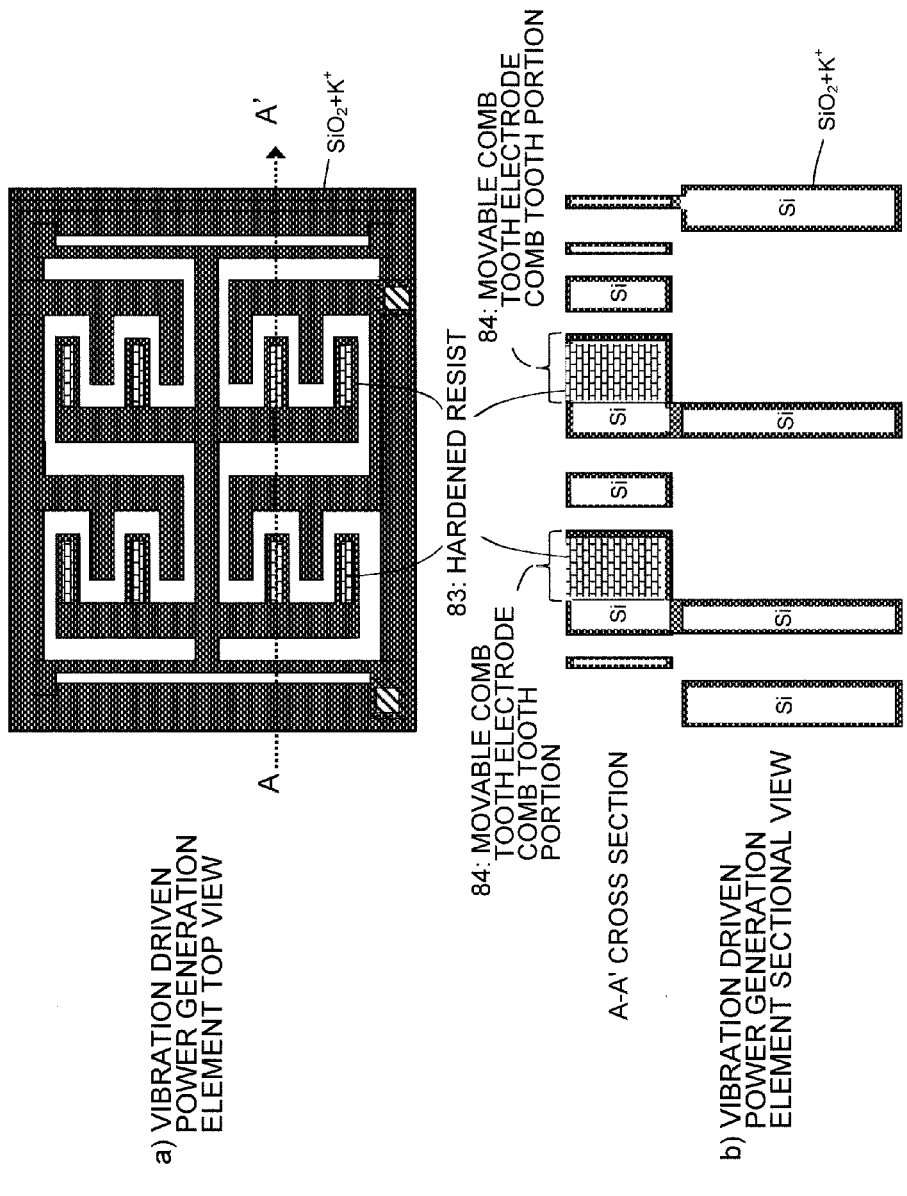

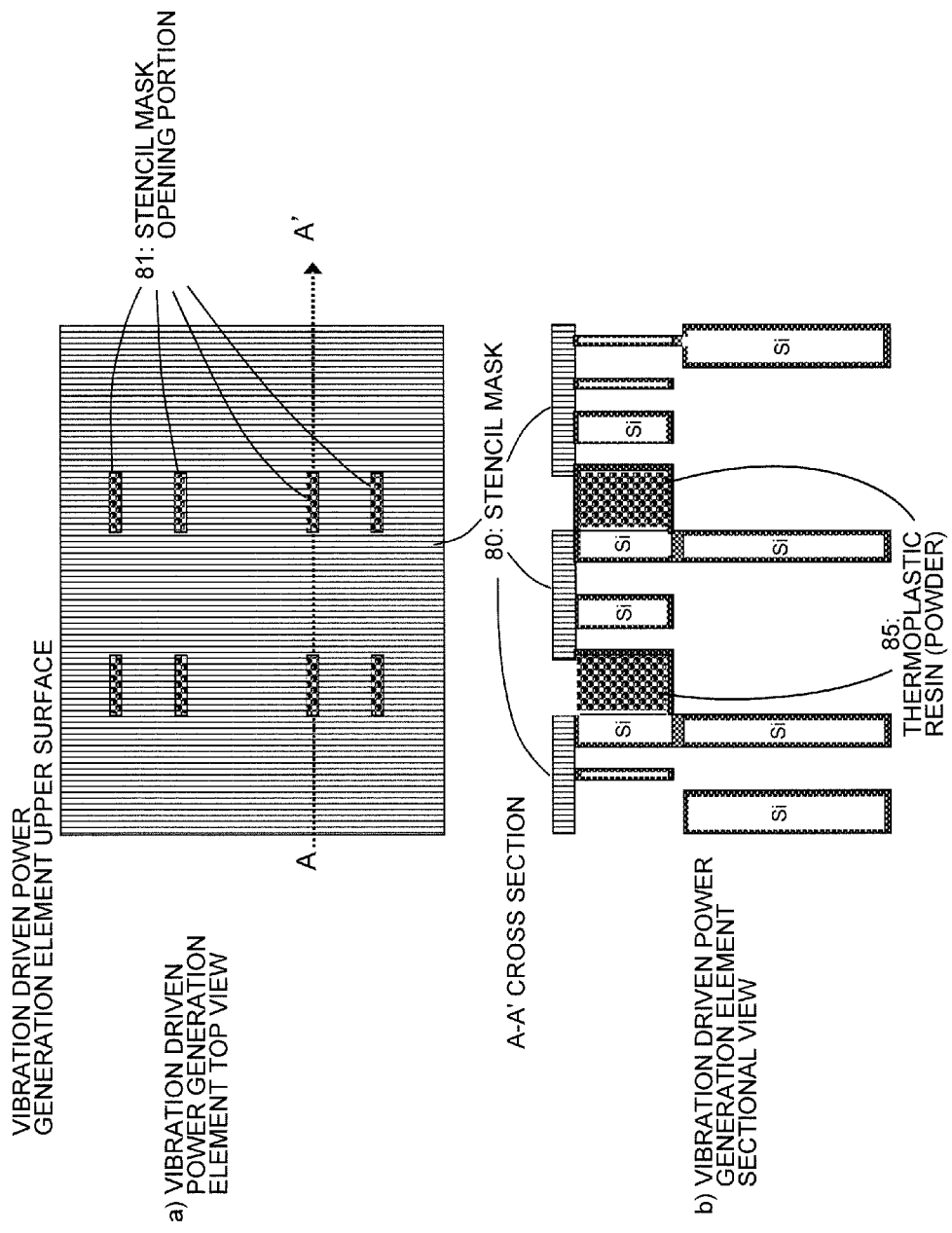

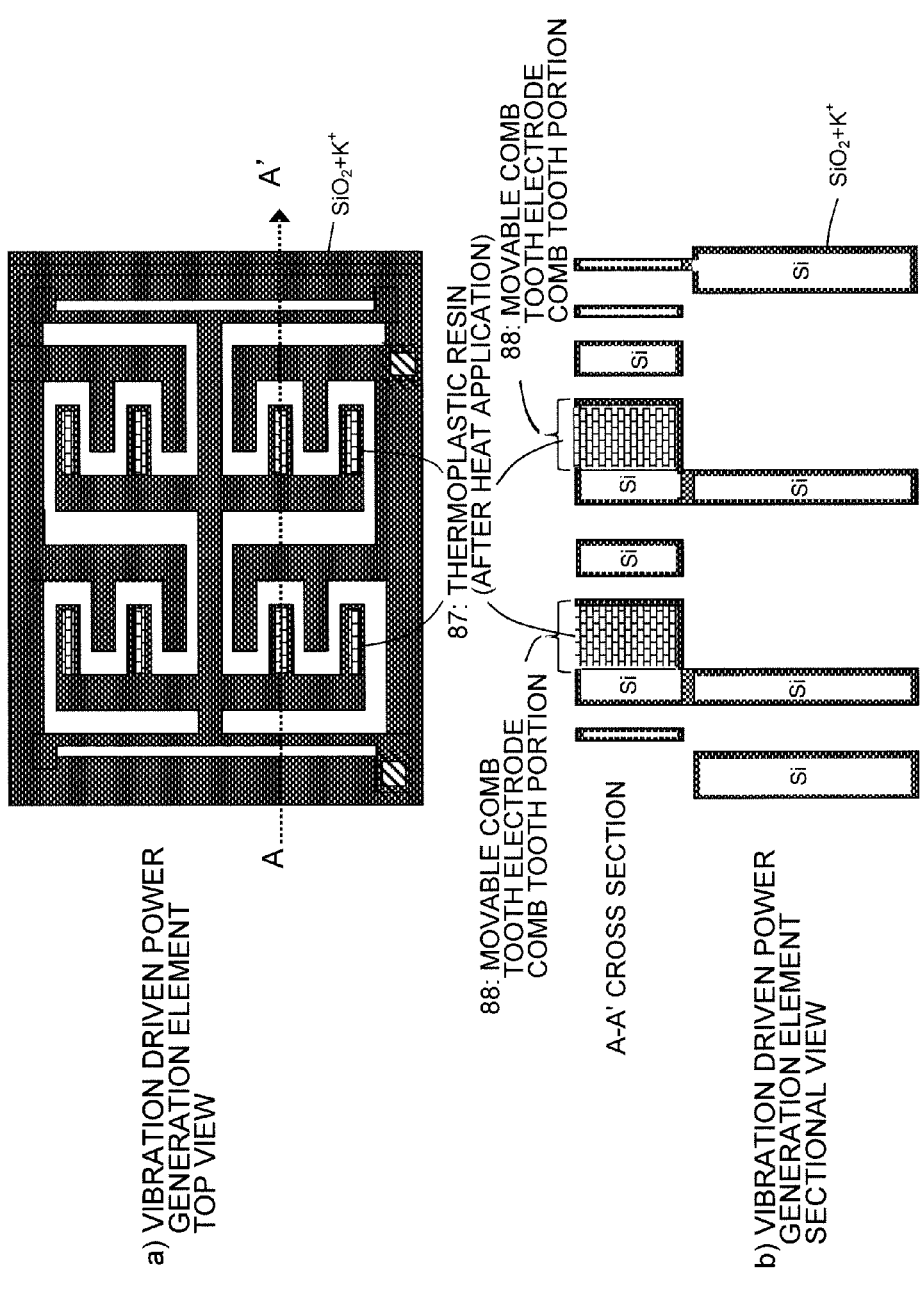

FIG.6A

REINFORCEMENT CONSTRUCTION FOR COMB TOOTH ELECTRODE CONSTRUCTION 2
PROCESS #2-5A: RESIST APPLICATION, EXPOSURE, AND DEVELOPMENT

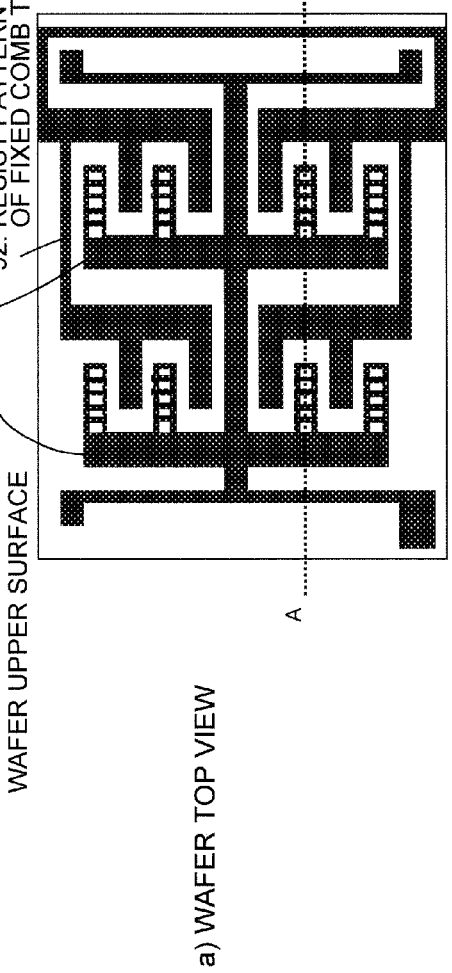

91: RESIST PATTERN FOR FORMATION OF MOVABLE COMB TOOTH ELECTRODE
92: RESIST PATTERN FOR FORMATION OF FIXED COMB TOOTH ELECTRODE a) WAFER TOP VIEW — WAFER UPPER SURFACE

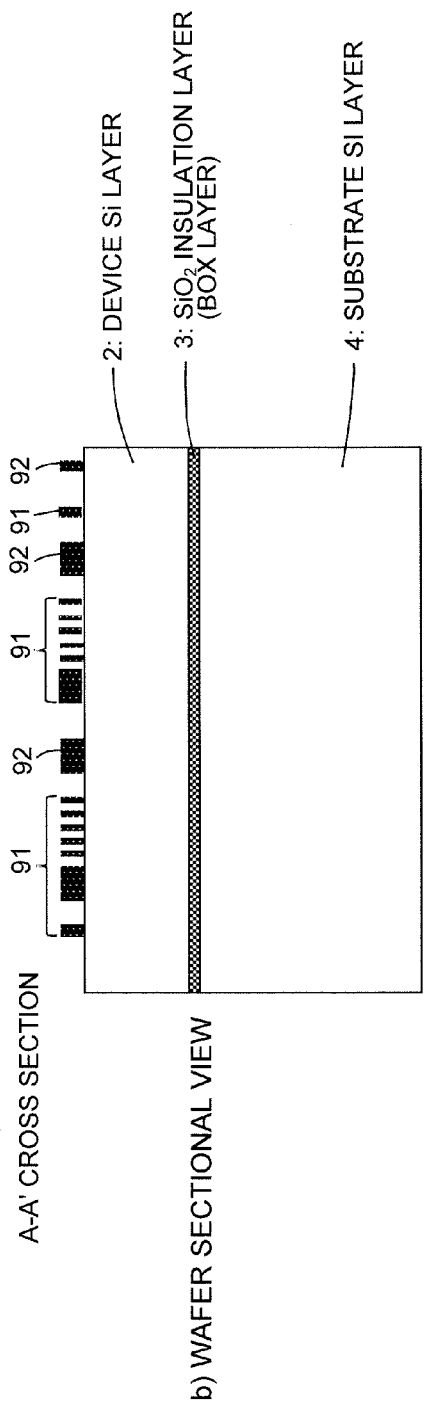

2: DEVICE Si LAYER
3: SiO₂ INSULATION LAYER (BOX LAYER)
4: SUBSTRATE Si LAYER

A-A' CROSS SECTION b) WAFER SECTIONAL VIEW

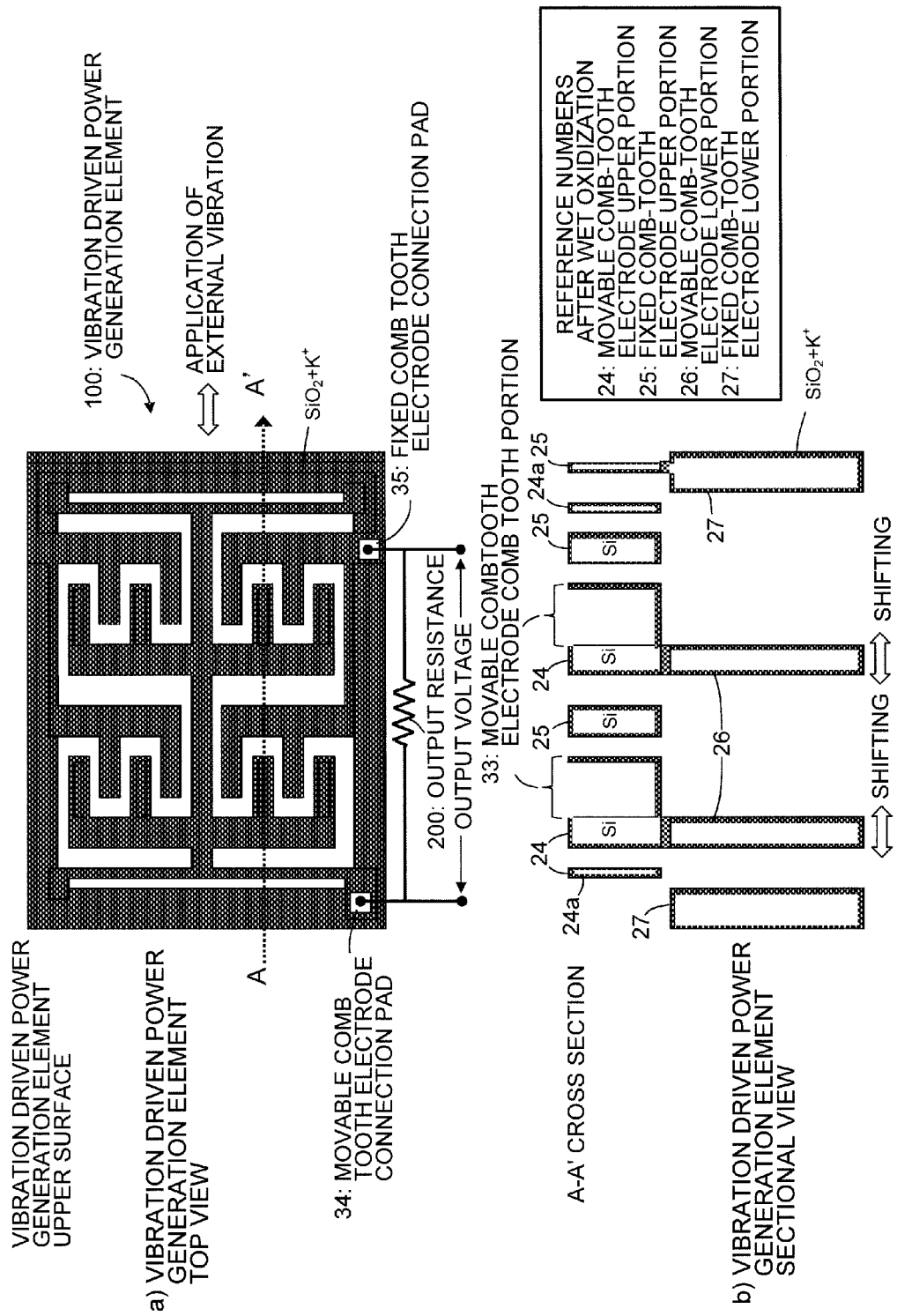
FIG.7 VIBRATION DRIVEN POWER GENERATION ELEMENT OPERATION

VIBRATION DRIVEN POWER GENERATION ELEMENT AND METHOD OF MANUFACTURE THEREOF

INCORPORATION BY REFERENCE

The disclosure of the following priority application is herein incorporated by reference: Japanese Patent Application No. 2012-036247 filed Feb. 22, 2012.

BACKGROUND OF THE INVENTION

1. Field of the Invention

The present invention relates to a vibration driven power generation element and to a method of manufacture thereof.

2. Description of Related Art

Power generation elements that convert vibrational energy into electrical energy of a type that incorporates an electret with two mutually opposing planar comb tooth type electrodes are per se known. Almost all of these have a structure in which comb teeth are provided to two mutually opposing rectangular regions (for example, refer to Japanese Laid-Open Patent Publication 2010-136598) or circular regions (for example, refer to Japanese Laid-Open Patent Publication 2011-072070).

With a power generation element utilizing a structure in which an electret is provided with such planar comb tooth type electrodes, it is necessary to make the electrode area large in order to increase the power generation capacity, and accordingly it has been difficult to manufacture a power generation element that is compact and whose output is large.

In recent years, a compact power generation element has been manufactured in which the electrostatic capacitance between the two mutually opposing electrodes is increased by applying MEMS technology, and by forming these comb tooth electrodes in a three-dimensional structure. For example, mutually opposing three-dimensional comb tooth electrodes of this type are used in the power generation element disclosed in Japanese Laid-Open Patent Publication 2010-011547, and an electret that is provided in the vicinity of the comb tooth electrodes is employed as a means for applying voltage between the electrodes.

Generally, construction of an electret is performed by injecting electric charges into an insulation layer with a corona electrical discharge. However, with an electret that is manufactured by this method, there are the problems that the charge density in the insulation layer is low, and that the charge level drops due to usage over the long term, and accordingly a construction for an electret is desired that provides a higher charge density and moreover a longer working life.

And, in Japanese Laid-Open Patent Publication 2010-068643, there is disclosed a construction for forming an electret having planar comb tooth electrodes. In this construction, while applying heat to an alkali glass at a temperature that is less than the glass transition temperature, a voltage of around 500 V to around 1000 V is applied thereto, and the alkali ions in this alkali glass are thereby shifted so that a region that is depleted in alkali ions is formed.

In an article by Honzumi et al. (Honzumi, M., Ueno, A., Hagiwara, K., Suzuki, Y., Tajima, T., and Kasagi, N., "Soft-X-Ray-Charged Vertical Electrets and Its Application to Electrostatic Transducers", Proc. 23rd IEEE Int. Conf. MEMS, Hong Kong, China, Jan. 24-28, 2010, pp. 635-638), there is disclosed a method for forming an electret by irradiating soft X-rays into between comb tooth electrodes having a three-dimensional structure, and thereby injecting electric charges generated in the atmosphere into the insulating layer for the electret. However, with this method as well, in a similar manner to the case of charge insertion by corona discharge, it is difficult to make the charge density in the insulation layer high.

SUMMARY OF THE INVENTION

With prior art building methods and constructions for electrets, it has not been possible to maintain large electric charge density over the long term. Moreover, it has not been possible to form electret electrodes that hold charge at high density in mutually three dimensionally opposing comb tooth electrodes.

According to the 1st aspect of the present invention, a vibration driven power generation element, comprises: a three dimensionally shaped movable comb tooth electrode comprising a plurality of comb teeth of which interiors are filled with an insulating material, and having an $SiO_2$ layer into which alkali ions are injected provided upon its outer surface; and a fixed type comb tooth electrode provided with a plurality of comb teeth made from Si the interiors of which are doped so as to have low electrical resistance, being arranged with the three dimensionally shaped movable comb tooth electrode opposed thereto and interleaved thereinto.

According to the 2nd aspect of the present invention, in a vibration driven power generation element according to the 1st aspect, it is preferred that the alkali ions are K+ ions or Na+ ions.

According to the 3rd aspect of the present invention, in a vibration driven power generation element according to the 1st or 2nd aspect, it is preferred that the insulating material in the interiors of the comb teeth of the three dimensionally shaped movable comb tooth electrode is made from thermoplastic resin.

According to the 4th aspect of the present invention, in a vibration driven power generation element according to the 1st or 2nd aspect, it is preferred that the insulating material in the interiors of the comb teeth of the three dimensionally shaped movable comb tooth electrode is an insulating gas.

According to the 5th aspect of the present invention, in a vibration driven power generation element according to the 1st or 2nd aspect, it is preferred that the insulating material in the interiors of the comb teeth of the three dimensionally shaped movable comb tooth electrode is a negative type resist that has been hardened.

According to the 6th aspect of the present invention, in a vibration driven power generation element according to the 1st or 2nd aspect, it is preferred that the insulating material in the interiors of the comb teeth of the three dimensionally shaped movable comb tooth electrode is an insulating structure and/or an insulating gas, and the insulating structure has a structure that reinforces rigidity of each of the comb teeth of the three dimensionally shaped movable comb tooth electrode.

According to the 7th aspect of the present invention, in a vibration driven power generation element according to any one of the 1st through 6th aspects, it is preferred that an anchor portion is provided at a lower portion of the three dimensionally shaped movable comb tooth electrode.

According to the 8th aspect of the present invention, in a vibration driven power generation element according to any one of the 1st through 7th aspects, wherein a layer of a hydrophobic material is formed over an entire surface of the vibration-driven power generation element.

According to the 9th aspect of the present invention, a method of manufacturing a vibration driven power generation element according to the 7th aspect, comprises: a first process of preparing an SOI wafer including: a substrate Si layer; an $SiO_2$ insulation layer provided over the substrate Si layer; and a device Si layer whose resistance has been lowered by doping, provided over that $SiO_2$ insulation layer; a second process of forming, on the device Si layer: an upper portion of a movable comb tooth electrode that includes movable comb tooth electrode comb teeth; and an upper portion of a fixed comb tooth electrode that includes fixed comb tooth electrode comb teeth; a third process of forming, on the substrate Si layer: a lower portion of the movable comb tooth electrode that includes an anchor portion of the movable comb tooth electrode; and a lower portion of the fixed comb tooth electrode that includes a support portion of the fixed comb tooth electrode; a fourth process of forming cavities in the interiors of the comb tooth electrode comb teeth portions; and a fifth process of, before the fourth process, forming an $SiO_2$ layer including alkali ions on an exposed portion of a surface of an Si layer (the device Si layer and the substrate Si layer) of the vibration driven power generation element.

According to the 10th aspect of the present invention, in a method of manufacturing a vibration driven power generation element according to the 9th aspect, it is preferred that, in the fifth process, wet oxidization is performed by applying heat to the vibration driven power generation element in an atmosphere of water vapor including alkali ions.

According to the 11th aspect of the present invention, in a method of manufacturing a vibration driven power generation element according to the 9th or 10th aspect, it is preferred that the alkali ions are K+ ions or Na+ ions.

BRIEF DESCRIPTION OF THE DRAWINGS

FIG. 1A is a figure for explanation of a process (Process #1-1) in which an SOI wafer is prepared for manufacturing a vibration driven power generation element according to the present invention;

FIG. 1B is a figure for explanation of a process (Process #1-2) in which upper portions of a first embodiment of the vibration driven power generation element according to the present invention (i.e. upper portions of a movable comb tooth electrode and of a fixed comb tooth electrode thereof) are formed;

FIG. 1C is a figure for explanation of a further process (Process #1-3) in which upper portions of a comb tooth construction of the first embodiment of the vibration driven power generation element according to the present invention (i.e. upper portions of the movable comb tooth electrode and of the fixed comb tooth electrode thereof) are formed;

FIG. 1D is a figure for explanation of a further process (Process #1-4) in which upper portions of the comb tooth construction of the first embodiment of the vibration driven power generation element according to the present invention (i.e. upper portions of the movable comb tooth electrode and of the fixed comb tooth electrode thereof) are formed;

FIG. 1E is a figure for explanation of a further process (Process #1-5) in which upper portions of the comb tooth construction of the first embodiment of the vibration driven power generation element according to the present invention (i.e. upper portions of the movable comb tooth electrode and of the fixed comb tooth electrode thereof) are formed;

FIG. 1F is a figure for explanation of a further process (Process #1-6) in which upper portions of the comb tooth construction of the first embodiment of the vibration driven power generation element according to the present invention (i.e. upper portions of the movable comb tooth electrode and of the fixed comb tooth electrode thereof) are formed;

FIG. 1G is a figure for explanation of a further process (Process #1-7) in which upper portions of the comb tooth construction of the first embodiment of the vibration driven power generation element according to the present invention (i.e. upper portions of the movable comb tooth electrode and of the fixed comb tooth electrode thereof) are formed;

FIG. 1H is a figure for explanation of a process (Process #1-8) in which preparations are performed for forming lower portions of the first embodiment of the vibration driven power generation element according to the present invention (i.e. lower portions of the movable comb tooth electrode and of the fixed comb tooth electrode thereof);

FIG. 1I is a figure for explanation of a further process (Process #1-9) in which lower portions of the first embodiment of the vibration driven power generation element according to the present invention (i.e. lower portions of the movable comb tooth electrode and of the fixed comb tooth electrode thereof) are formed;

FIG. 1J is a figure for explanation of a further process (Process #1-10) in which lower portions of the first embodiment of the vibration driven power generation element according to the present invention (i.e. lower portions of the movable comb tooth electrode and of the fixed comb tooth electrode thereof) are formed;

FIG. 1K is a figure for explanation of a further process (Process #1-11) in which the movable comb tooth electrode and the fixed comb tooth electrode of the first embodiment of the vibration driven power generation element according to the present invention are formed: in this process, the general structures of the movable comb tooth electrode and the fixed comb tooth electrode are formed and separated;

FIG. 1L is a figure for explanation of a process (Process #1-12) in which an $SiO_2$ layer including K+ ions is formed on the surface of the first embodiment of the vibration driven power generation element according to the present invention;

FIG. 1M is a figure for explanation of a process (Process #1-13) in which hollowed out structures are formed in comb tooth portions of the movable comb tooth electrode of the first embodiment of the vibration driven power generation element according to the present invention;

FIG. 1N is a figure for explanation of a process (Process #1-14) in which a protective layer is formed, so that no damage occurs to the output electrode pads during formation of these hollowed out structures in the comb tooth portions of the movable comb tooth electrode of the first embodiment of the vibration driven power generation element according to the present invention;

FIG. 1O is a figure for explanation of a further process (Process #1-15) in which the hollowed out structures in the comb tooth portions of the movable comb tooth electrode of the first embodiment of the vibration driven power generation element according to the present invention are formed;

FIG. 1P is a figure for explanation of a process (Process #1-16) in which the output electrode pads of the movable comb tooth electrode and the fixed comb tooth electrode of the first embodiment of the vibration driven power generation element according to the present invention are formed: while the vibration driven power generation element that is shown in this figure is the final form of the first embodiment, a further process that is explained is additionally performed in a variant embodiment;

FIG. 3B is a figure for explanation of a further process (Process #2-4) in which upper portions of the comb tooth construction of the second embodiment of the vibration driven power generation element according to the present invention (i.e. upper portions of the movable comb tooth electrode and of the fixed comb tooth electrode thereof) are formed;

FIG. 3C is a figure for explanation of a further process (Process #2-5) in which upper portions of the comb tooth construction of the second embodiment of the vibration driven power generation element according to the present invention (i.e. upper portions of the movable comb tooth electrode and of the fixed comb tooth electrode thereof) are formed;

FIG. 3D is a figure for explanation of a further process (Process #2-6) in which upper portions of the comb tooth construction of the second embodiment of the vibration driven power generation element according to the present invention (i.e. upper portions of the movable comb tooth electrode and of the fixed comb tooth electrode thereof) are formed;

FIG. 3E is a figure for explanation of a further process (Process #2-7) in which upper portions of the comb tooth construction of the second embodiment of the vibration driven power generation element according to the present invention (i.e. upper portions of the movable comb tooth electrode and of the fixed comb tooth electrode thereof) are formed;

FIG. 3F is a figure for explanation of a process (Process #2-8) in which preparations are performed for forming lower portions of the second embodiment of the vibration driven power generation element according to the present invention (i.e. lower portions of the movable comb tooth electrode and of the fixed comb tooth electrode thereof);

FIG. 3G is a figure for explanation of a process (Process #2-9) in which lower portions of the second embodiment of the vibration driven power generation element according to the present invention (i.e. lower portions of the movable comb tooth electrode and of the fixed comb tooth electrode thereof) are formed;

FIG. 3H is a figure for explanation of a further process (Process #2-10) in which lower portions of the second embodiment of the vibration driven power generation element according to the present invention (i.e. lower portions of the movable comb tooth electrode and of the fixed comb tooth electrode thereof) are formed;

FIG. 3I is a figure for explanation of a process (Process #2-11) in which the movable comb tooth electrode and the fixed comb tooth electrode of the second embodiment of the vibration driven power generation element according to the present invention are formed: in this process, the general structures of the movable comb tooth electrode and the fixed comb tooth electrode are formed and separated;

FIG. 3J is a figure for explanation of a process (Process #2-12) in which an $SiO_2$ layer including alkali ions (here, K+ ions) is formed on the surface of the second embodiment of the vibration driven power generation element according to the present invention;

FIG. 3K is a figure for explanation of a process (Process #2-14) in which preparations are made for forming electrode output pads of the movable comb tooth electrode and the fixed comb tooth electrode of the second embodiment of the vibration driven power generation element according to the present invention;

FIG. 4A relates to a first variant of the first embodiment (Process #1-15A1), and is a figure for explanation of a process that is performed in the case that a resist is used as an insulating substance that is hardened in hollowed out portions of the movable comb tooth electrode comb tooth portions, for enhancing the rigidity of these movable comb tooth electrode comb tooth portions: here, while the resist is injected into the hollowed out portions, it is not yet hardened, and this process is performed after Process #1-15;

FIG. 4B is a figure showing a state (Process #1-15A2) in which the resist that has been injected into the hollowed out portions of the movable comb tooth electrode comb tooth portions is hardened;

FIG. 5A relates to a second variant of the first embodiment (Process #1-15B1), and is a figure for explanation of a process that is performed in the case that a thermoplastic resin is used as an insulating substance that is enclosed in hollowed out portions of the movable comb tooth electrode comb tooth portions, for enhancing the rigidity of the movable comb tooth electrode comb tooth portions: here, thermoplastic resin powder is injected into the hollowed out portions;

FIG. 5B is a figure showing a state (Process #1-15B2) in which the thermoplastic resin powder that was enclosed in the hollowed out portions of the comb tooth portions is heated and cooled, so that it becomes a hardened solid mass of thermoplastic resin;

FIG. 6A relates to a variant of the second embodiment, and is a figure for explanation of a process that is performed when structures are formed in the hollowed out portions of the movable comb tooth electrode comb tooth portions, in order to enhance the rigidity of those movable comb tooth electrode comb tooth portions: here, a process of making a resist pattern in order to form this structure for the comb tooth electrode construction is shown (Process #2-5A, that is a variant of Process #2-5);

FIG. 7 is a figure for explanation of the operation of a vibration driven power generation element of the present invention: it should be understood that, here, by way of example, the vibration driven power generation element of the first embodiment is explained.

DESCRIPTION OF THE PREFERRED EMBODIMENTS

Figure 10:
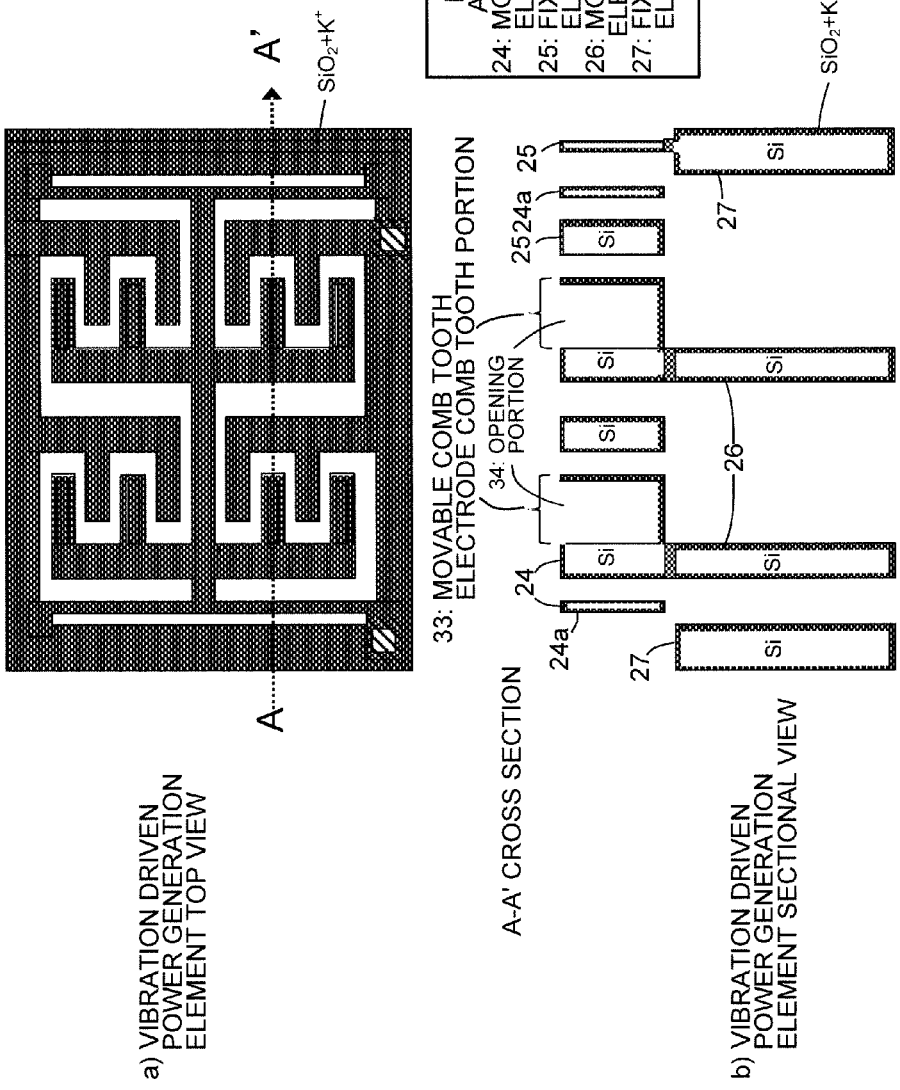

The vibration driven power generation element according to the present invention has a schematic structure as shown in FIG. 7, and performs generation of electricity due to the relative position varying between a fixed comb tooth electrode and a movable comb tooth electrode that function as electret electrodes. In the following, a construction for the electret electrodes according to the present invention and a method of manufacturing them, and the construction of a power generation element that is provided with these electret electrodes, will be explained with reference to FIGS. 1 through 6. It should be understood that in the following explanation, for example, different reference symbols are appended to the same sites upon the electret electrodes in different stages of the manufacturing process, even though the same names are used.

The First Embodiment

A method for forming a comb tooth electrode construction 1 that is a first embodiment of the vibration driven power generation element according to the present invention will now be explained with reference to FIGS. 1A through 1P and FIG. 2.

Process #1-1

First, as shown in FIG. 1A, an SOI wafer substrate is prepared that includes a device Si layer 2 and a substrate Si layer 4, with an insulating $SiO_2$ layer 3 (i.e. a BOX layer) being provided between these two. The thicknesses of these layers may, for example be: 5 to 100 μm for the device Si layer 2, 0.5 to 5 μm for the BOX layer 3, and 300 to 500 μm for the substrate Si layer 4.

The device Si layer 2 may, for example, be formed at the [100] orientation, and it is desirable to use an N type Si layer that is doped with, for example, phosphorous or the like, so that its resistivity is reduced to 0.1 Ω·cm or lower. As will be described hereinafter, this is so that electrode pads can be formed in ohmic contact with this N type Si layer in order to take out the output of the vibration driven power generation element. It should be understood that this doping is performed with the objective of lowering the resistivity, and it may be performed with some other substance than phosphorous; thus, a P type Si layer will also be acceptable.

Furthermore, in the drawings referred to in the following explanation, all of the portions that are shown correspond to a single vibration driven power generation element. However actually, as explained in the drawings, electrodes of a plurality of vibration driven power generation elements, and patterns of resist for forming them, are all formed together upon a single wafer substrate.

Process #1-2

Next, an $SiN_x$ layer 5 of thickness 30 to 150 nm is formed over the device Si layer 2 on the SOI wafer substrate 1 (refer to FIG. 1B). This $SiN_x$ layer 5 is further patterned for formation of the comb tooth electrodes (this will be described hereinafter). LP-CVD or PE-CVD may, for example, be used as the method for making this layer, but these methods are not to be considered as being limitative.

Process #1-3

A resist pattern 6 for formation of a movable comb tooth electrode as shown in FIG. 1C is formed over the $SiN_x$ layer 5 described above by, for example, applying a positive type resist over the entire surface, by exposing and developing this resist, and by removing the exposed resist portion. At this time, in order to provide wiring connections to the vibration driven power generation element when it has been completed, resist patterns 7 and 8 for formation of a movable comb tooth electrode connection pad and a fixed comb tooth electrode connection pad are also formed.

Process #1-4

In the state shown in FIG. 1C, the wafer is subjected to RIE processing using, for example, a hydrocarbon series gas, and thereby the $SiN_x$ layer 5 is removed. Furthermore, when the remaining resist patterns 6, 7, and 8 are removed by immersion in a resist stripping liquid, an $SiN_x$ pattern 9 for formation of the movable comb tooth electrode is formed, as shown in FIG. 1D.

Process #1-5

Next, resist patterns for further formation of the movable comb tooth electrode and of a fixed comb tooth electrode are formed (FIG. 1E). In the state shown in FIG. 1D, a positive type resist, for example, is applied over the entire wafer upper surface. And, after exposure and development, removal of the exposed portions of the resist is performed, and thereby a resist pattern 12 for movable comb tooth electrode formation and a resist pattern 13 for fixed comb tooth electrode formation are formed, as shown in FIG. 1E. It should be understood that the basic shapes of the resist patterns for formation of the movable comb tooth electrode and of the fixed comb tooth electrode are determined by the pattern of the resist in this Process #1-5.

Process #1-6

In the state shown in FIG. 1E, the wafer is subjected to, for example ICP-RIE processing, and thereby the device Si layer 2 is etched. At this time, the portions of the $SiN_x$ pattern for movable comb tooth electrode formation 9 that are not covered by the resist pattern 12 are also etched, so that an $SiN_x$ pattern 14 for movable comb tooth electrode formation results, having a shape as shown in FIG. 1F. It should be understood that, since during this etching by ICP-RIE the etching speed of the BOX layer 3 is slow, accordingly only portions of the device Si layer 2 and the $SiN_x$ pattern for movable comb tooth electrode formation 9 are etched, and the etching terminates at the state in which the BOX layer 3 is visible from the wafer upper surface.

Process #1-7

When, in the state shown in FIG. 1F, the wafer is immersed in a resist stripping liquid, and the resist patterns 12 and 13 are removed using ultrasonic washing or the like, the device reaches a state as shown in FIG. 1G. In this state, $SiN_x$ patterns 14, 10, and 11 remain for processing of the comb tooth portions of the movable comb tooth electrode, and in order to form a movable comb tooth electrode connection pad and a fixed comb tooth electrode connection pad.

Process #1-8

Next, in the state shown in FIG. 1G, a protective aluminum layer 17 is formed using, for example, spattering, over the entire upper surface of the wafer (refer to FIG. 1H). This is done in order to provide protection with the aluminum layer 17 so that, even while subsequent processing is being performed upon the lower surface side of the wafer, the upper surface side does not experience any negative effects at this time.

Process #1-9

Processing of the lower surface side of the wafer is now performed in order to form the lower side portions of the comb tooth electrodes of the vibration driven power generation element. In the state shown in FIG. 1H, the wafer is turned over, and resist patterns are formed in order to form lower portions of the movable comb tooth electrode and of the fixed comb tooth electrode. First, for example, a positive type resist is applied over the entire surface, and this is exposed and developed, so that, as shown in FIG. 1I, a resist pattern 18 for formation of a movable comb tooth electrode lower portion (i.e. for forming anchor portions thereof) and a resist pattern 19 for formation of a fixed comb tooth electrode lower portion (i.e. for forming a support frame for the vibration driven power generation element) are formed.

Process #1-10

With the wafer in the state shown in FIG. 1I, its thick substrate Si layer is etched using ICP-RIE, so that the lower portions of the movable comb tooth electrode and of the fixed comb tooth electrode are formed (refer to FIG. 1J).

Process #1-11

Next, the resist pattern 18 for formation of the movable comb tooth electrode lower portion (i.e. of its anchor portions), the resist pattern 19 for formation of the fixed comb tooth electrode lower portion (i.e. of the support frame of the vibration driven power generation element), and the aluminum layer 17 are removed by SPM washing. When the resist patterns 18 and 19 are removed by using ashing, the aluminum layer 17 is removed using some other process, for example by using a mixed acid or the like. Furthermore, the BOX layer 3 is removed by wet etching using a buffered hydrofluoric acid solution, or by dry etching or the like using HF vapor, and, as shown in FIG. 1K, the lower portion of the movable comb tooth electrode (i.e. its anchor portions) 20 and the lower portion of the fixed comb tooth electrode (i.e. the support frame for the vibration driven power generation element) 21 are formed, and thereby the basic structure of the vibration driven power generation element is formed.

Due to this processing, the BOX layer 3 is removed, with the exception of connecting portions thereof that connect together the upper and lower portions of each of the movable comb tooth electrode and the fixed comb tooth electrode. It should be understood that, in this processing, the common general overall structure as a wafer substrate that was present from the start disappears, and thus, in the explanation of this and subsequent processes, the entire unit is no longer referred to as a "wafer", but as a "vibration driven power generation element". However, since actually a plurality of the vibration driven power generation elements shown in FIG. 1K are formed upon the one wafer, accordingly in practice this and subsequent processes are performed upon a construction having the general form of the wafer, and consisting of a plurality of the vibration driven power generation elements in the state of being joined together in the general shape of the wafer.

Process #1-12

In FIG. 1L and subsequently, the vibration driven power generation element is shown as again turned over with its top, bottom, left, and right again interchanged, so that it is in an erect state similar to its state in FIGS. 1A through 1H. In this process, due to the vibration driven power generation element in the state shown in FIG. 1K being subjected to wet oxidization (as will be described hereinafter), the surfaces of its Si portion that are exposed are oxidized to $SiO_2$ as shown in FIG. 1L, and, along with this layer of $SiO_2$ being formed, also alkali ions such as, for example, K+ ions are injected into this $SiO_2$ layer. This $SiO_2$ layer may, for example, be made to be around 2 μm thick. It should be understood that the Si portions that are covered over by the remaining $SiN_x$ patterns, i.e. by the $SiN_x$ pattern 14 for movable comb tooth electrode comb tooth formation, by the $SiN_x$ pattern 10 for movable comb tooth electrode connection pad formation, and by the $SiN_x$ pattern 11 for fixed comb tooth electrode connection pad formation, are not oxidized, but are each processed in the subsequent processes.

Process #1-13

In this process, the above described patterns 14, 10, and 11 where $SiN_x$ remains are removed by wet etching using, for example, an aqueous solution of phosphoric acid or the like, so that portions corresponding to the device Si layer of FIGS. 1A through 1E are exposed (these are the movable comb tooth electrode exposed Si portions 28 in FIG. 1M). These portions where the Si layer is exposed are the portions designated by the reference symbols 28 through 30, as shown in FIG. 1M.

Process #1-14

In this process, protective aluminum layers are formed, so that the connection pads for the movable comb tooth electrode and the fixed comb tooth electrode will not be etched by the etching of the Si portions that is performed in the next process. As shown in FIG. 1N, respective protective aluminum layers 31 and 32 for movable comb tooth electrode connection pad formation and for fixed comb tooth electrode connection pad formation are formed upon the connection pads for the movable comb tooth electrode and for the fixed comb tooth electrode. It should be understood that the formation of these protective aluminum layers is performed by spattering or the like, using a stencil mask having an aperture that includes the areas surrounding the connection pads.

Process #1-15

In the state shown in FIG. 1N, the vibration driven power generation element is etched using ICP-RIE. By doing this, the exposed Si portions 28 of the movable comb tooth electrode where the Si portion is exposed in the vertical direction are removed (refer to FIG. 1M), so that hollowed out comb tooth portions 33 are formed having opening portions 34 (refer to FIG. 1O). The $SiO_2$ layer that was formed in Process #1-12 by wet oxidization remains at these comb tooth portions 33. This $SiO_2$ layer at the comb tooth portions 33 will function as an electret.

Process #1-16

With the vibration driven power generation element in the state shown in FIG. 1O, processing is performed to remove the protective aluminum layer over the connection pads 35 and 36 of the movable comb tooth electrode and the fixed comb tooth electrode, so as to make wire bonding to these connection pads possible. In concrete terms, the protective aluminum layer is removed, and layers made from three layers of Cr, Ni, and Au are formed over the exposed Si portions. The Cr layers adhere to the Si portions, and wire bonding can be performed to the Au layers.

By the above processes, the manufacture of this comb tooth electrode construction 1 that is the first embodiment of the vibration driven power generation element 100 according to the present invention is completed (refer to FIG. 1P). Since the comb tooth electrodes of the vibration driven power generation element according to the present invention are three dimensional comb tooth electrodes, accordingly it is possible to make the $SiO_2$ layer on these comb tooth electrodes, in which the alkali ions (i.e. the K+ ions) are included and that functions as an electret, large in area, so that it is possible to make the output of this vibration driven power generation element large. It should be understood that while, in FIGS. 1O and 1P, portions of the movable comb tooth electrode 24 are designated by the reference symbols 24a, these portions are elastic support portions that support the movable comb tooth electrode 24. Furthermore, the movable comb tooth electrode connection pad 35 is formed upon a portion of one of these movable comb tooth electrode support portions 24a.

The Method for Diffusing Alkali Ions into the $SiO_2$ Layer

Figure 2:
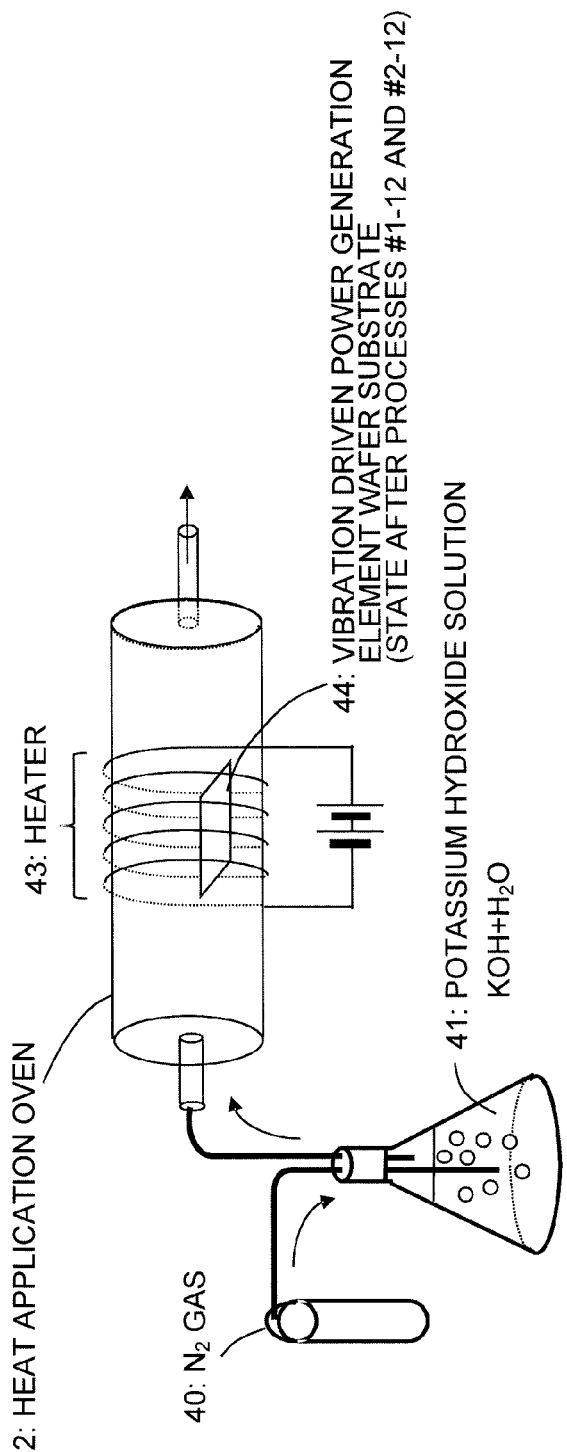
FIG. 2 is a schematic figure showing a method of wet oxidization that is used for forming an $SiO_2$ layer including alkali ions (here, K+ ions) on the surface of the wafer (i.e. of the vibration driven power generation element) during the processing shown in FIG. 1L or FIG. 3J.

FIG. 2 is a figure showing in a simple manner the theory of the method for formation of the $SiO_2$ layer in which alkali ions (K+ ions) have been injected by Process #1-12 described above that has been explained with reference to FIG. 1L, and is a figure showing a so-called wet oxidization method.

When forming an $SiO_2$ layer in which K+ ions have been injected, $N_2$ gas is passed through an aqueous solution 41 in which KOH is dissolved in pure water, and thereby this $N_2$ gas is loaded with water vapor in which K+ ions are included. This gas including water vapor is conducted to a heating oven 42, and thereby an SiO₂ layer in which K+ ions are included is formed upon a Si wafer substrate 44 that is received within this heating oven 42.

It is considered that OH groups present upon the surface of the SiO₂ make a contribution to the absorption of alkali ions such as K+ ions or the like into the SiO₂ layer. Especially with the wet etching that is used in the present invention, it is conjectured that a large amount of OH groups are present upon the surface of the SiO₂ layer that has been formed upon the Si layer, and that the alkali ions are absorbed with good efficiency so as to couple with these OH groups.

It should be understood that it would be possible to form an SiO₂ layer that operates as an electret electrode, using alkali ions other than K+ ions. For example, if an SiO₂ layer is to be formed in which Na+ ions are injected, then an aqueous solution of NaOH should be used, instead of an aqueous solution of KOH.

The Second Embodiment

The second embodiment is also a vibration driven power generation element having a comb tooth electrode construction according to the present invention (a comb tooth electrode construction 1). A method for manufacturing this comb tooth electrode construction will now be explained with reference to FIGS. 3A through 3L.

The feature of difference from the first embodiment is that, in this second embodiment, the SiO₂ in the comb tooth portion 33 of the movable comb tooth electrode shown in FIGS. 1O and 1P has no bottom portion, so that this portion presents the shape of a through hole. The manufacturing process becomes simpler as compared with the first embodiment, but sometimes it may happen that the comb tooth portion becomes deformed due to the absence of the bottom portion of the SiO₂. It should be understood that an expedient in the construction for preventing such deformation will be explained in a variant embodiment that will be described hereinafter.

The differences between this method of manufacturing the vibration driven power generation element of the second embodiment and the method of the first embodiment relate to Process #1-3 and subsequent processes explained with reference to the first embodiment, and accordingly, in the following explanation, the method of manufacturing the vibration driven power generation element of this second embodiment will be explained starting from Process #2-3. Thus, Processes #2-1 and #2-2 are the same as Processes #1-1 and #1-2 in the first embodiment respectively. It should be noted that, even though the sites on the wafer that are processed by Process #2-3 and subsequently are sites that are the same as in the first embodiment, different reference numbers are appended to them in the explanation.

Process #2-3

Figure 3A:
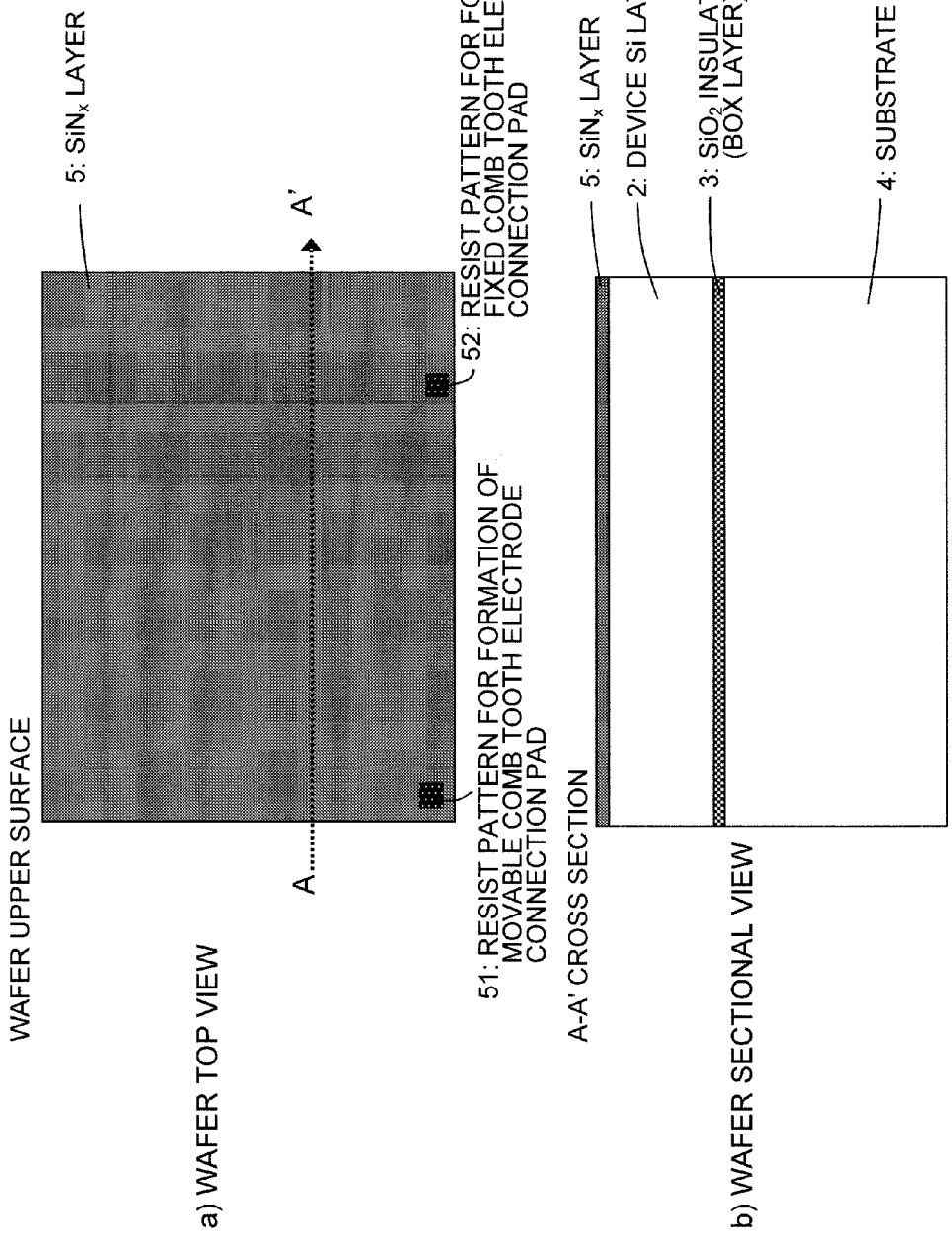
FIG. 3A is a figure for explanation of a process (Process #2-3) in which upper portions of a comb tooth construction of a second embodiment of the vibration driven power generation element according to the present invention (i.e. upper portions of a movable comb tooth electrode and of a fixed comb tooth electrode thereof) are formed.

By applying, for example, a positive type resist over the entire surface of the SiN$_x$ layer 5 of the wafer when it is in the state shown in FIG. 1B as explained with reference to the first embodiment, by exposing and developing this resist, and by performing removal of the exposed resist portion, as shown in FIG. 3A, resist patterns 51 and 52 for formation of a movable comb tooth electrode connection pad and a fixed comb tooth electrode connection pad are formed in order to provide wiring connections to the vibration driven power generation element when it has been completed.

Process #2-4

In the state shown in FIG. 3A, the wafer is subjected to RIE processing using, for example, a hydrocarbon series gas, and thereby the SiN$_x$ layer 5 is removed. Furthermore, when the remaining resist patterns 51 and 52 are removed by immersion in a resist stripping liquid, SiN$_x$ patterns 53 and 54 for formation of a movable comb tooth electrode connection pad and a fixed comb tooth electrode connection pad respectively are formed, as shown in FIG. 3B.

Process #2-5

Next, resist patterns for formation of the movable comb tooth electrode and of the fixed comb tooth electrode are formed (FIG. 3C). In the state shown in FIG. 3B, a positive type resist, for example, is applied over the entire wafer upper surface. And, after exposure and development, removal of the exposed portions of the resist is performed, and thereby a resist pattern 55 for movable comb tooth electrode formation and a resist pattern 56 for fixed comb tooth electrode formation are formed, as shown in FIG. 3C. It should be understood that the basic shapes of the resist patterns for formation of the movable comb tooth electrode and of the fixed comb tooth electrode are determined by the patterns 55 and 56 of the resist in this Process #2-5.

Process #2-6

In the state shown in FIG. 3C, the wafer is subjected to, for example ICP-RIE processing, and thereby the device Si layer 2 is etched, and, as shown in FIG. 3D, a movable comb tooth electrode upper portion 57 and a fixed comb tooth electrode upper portion 58 are formed, having the same shapes as seen from the wafer upper surface as the resist patterns 55 and 56 (refer to FIG. 3E). It should be understood that, since during this etching by ICP-RIE the etching speed of the BOX layer 3 is slow, accordingly only the device Si layer 2 is etched, and the etching terminates at the state in which the BOX layer 3 can be seen from the wafer upper surface.

Process #2-7

When, in the state shown in FIG. 3D, the wafer is immersed in a resist stripping liquid, and the resist patterns 55 and 56 are removed using ultrasonic washing or the like, the situation becomes as shown in FIG. 3E. It should be understood that, in this state, the SiN$_x$ patterns 53 and 54 are left remaining, for the formation of a movable comb tooth electrode connection pad and a fixed comb tooth electrode connection pad respectively.

Process #2-8

Next, in the state shown in FIG. 3E, a protective aluminum layer 59 is formed using, for example, spattering, over the entire upper surface of the wafer (refer to FIG. 3F). This is done in order to provide protection with the aluminum layer 59 so that, even while subsequent processing is being performed upon the lower surface side of the wafer, the upper surface side does not experience any negative influence at this time.

Process #2-9

Processing of the lower surface side of the wafer is now performed in order to form the lower side portions of the comb tooth electrodes of this vibration driven power generation element. In the state shown in FIG. 3F, the wafer is turned over, and resist patterns are formed for manufacturing the lower portions of the movable comb tooth electrode and of the fixed comb tooth electrode. First, for example, a positive type resist is applied over the entire surface, and this is exposed and developed, so that, as shown in FIG. 3G, a resist pattern 61 for formation of a movable comb tooth electrode lower portion (i.e. for forming anchor portions thereof) and a resist pattern 62 for formation of a fixed comb tooth electrode lower portion (i.e. for forming a support frame for the vibration driven power generation element) are formed.

Process #2-10

With the wafer in the state shown in FIG. 3G, its thick substrate Si layer is etched using ICP-RIE, so that the lower portions of the movable comb tooth electrode and of the fixed comb tooth electrode are formed (refer to FIG. 3H).

Process #2-11

Next, the resist pattern 61 for formation of the movable comb tooth electrode lower portion (i.e. of its anchor portions), the resist pattern 62 for formation of the fixed comb tooth electrode lower portion (i.e. of the support frame for the vibration driven power generation element), and the aluminum layer 59, are removed by SPM washing.

While the resist patterns 61 and 62 are removed by using ashing, the aluminum layer 59 is removed using some other process, for example by using a mixed acid or the like. Furthermore, the BOX layer 3 is removed by wet etching using a buffered hydrofluoric acid solution, or by dry etching or the like using HF vapor, and, as shown in FIG. 3I, the lower portion 63 of the movable comb tooth electrode (i.e. its anchor portions) and the lower portion 64 of the fixed comb tooth electrode (i.e. the support frame of the vibration driven power generation element) are formed, and thereby the basic structure of the vibration driven power generation element is formed.

Due to this processing, the BOX layer 3 is removed, with the exception of connecting portions thereof that connect together the upper and lower portions of each of the movable comb tooth electrode and the fixed comb tooth electrode. It should be understood that, in this processing, the common general overall structure as a wafer substrate that was present from the start disappears, and thus, in the explanation of this and subsequent processes, the entire unit is no longer referred to as a "wafer", but as a "vibration driven power generation element". However, since actually a plurality of the vibration driven power generation elements shown in FIG. 3I are formed upon the one wafer, accordingly in practice this and subsequent processes are performed upon a construction having the general form of the wafer, and consisting of a plurality of the vibration driven power generation elements in the state of being joined together in the general shape of the wafer.

Process #2-12

In FIG. 3J and subsequently, the vibration driven power generation element is shown as again turned over with its top, bottom, left, and right again interchanged, so that it is in an erect state similar to its state in FIGS. 3A through 3F. In this process, due to the vibration driven power generation element in the state shown in FIG. 3I being subjected to wet oxidization as previously described, the surfaces of its Si portion that are exposed are oxidized to $SiO_2$ as shown in FIG. 3J, so that, along with a layer of $SiO_2$ being formed, also alkali ions such as, for example, K+ ions are injected into this $SiO_2$ layer. This $SiO_2$ layer may, for example, be made to be around 2 μm thick. It should be understood that the Si portions that are covered over by the remaining $SiN_x$ patterns, i.e. by the $SiN_x$ pattern 53 for movable comb tooth electrode connection pad formation and by the $SiN_x$ pattern 54 for fixed comb tooth electrode connection pad formation, are not oxidized, but are each processed in the subsequent processes.

Process #2-13

In this process, the above described patterns 53 and 54 where $SiN_x$ remains are removed by wet etching using, for example, an aqueous solution of phosphoric acid or the like, so that the remaining portions of the device Si layer are exposed, and the movable comb tooth electrode connection pad portion 71 and the fixed comb tooth electrode connection pad portion 72 are exposed (refer to FIG. 3K).

Process #2-14

Figure 3L:
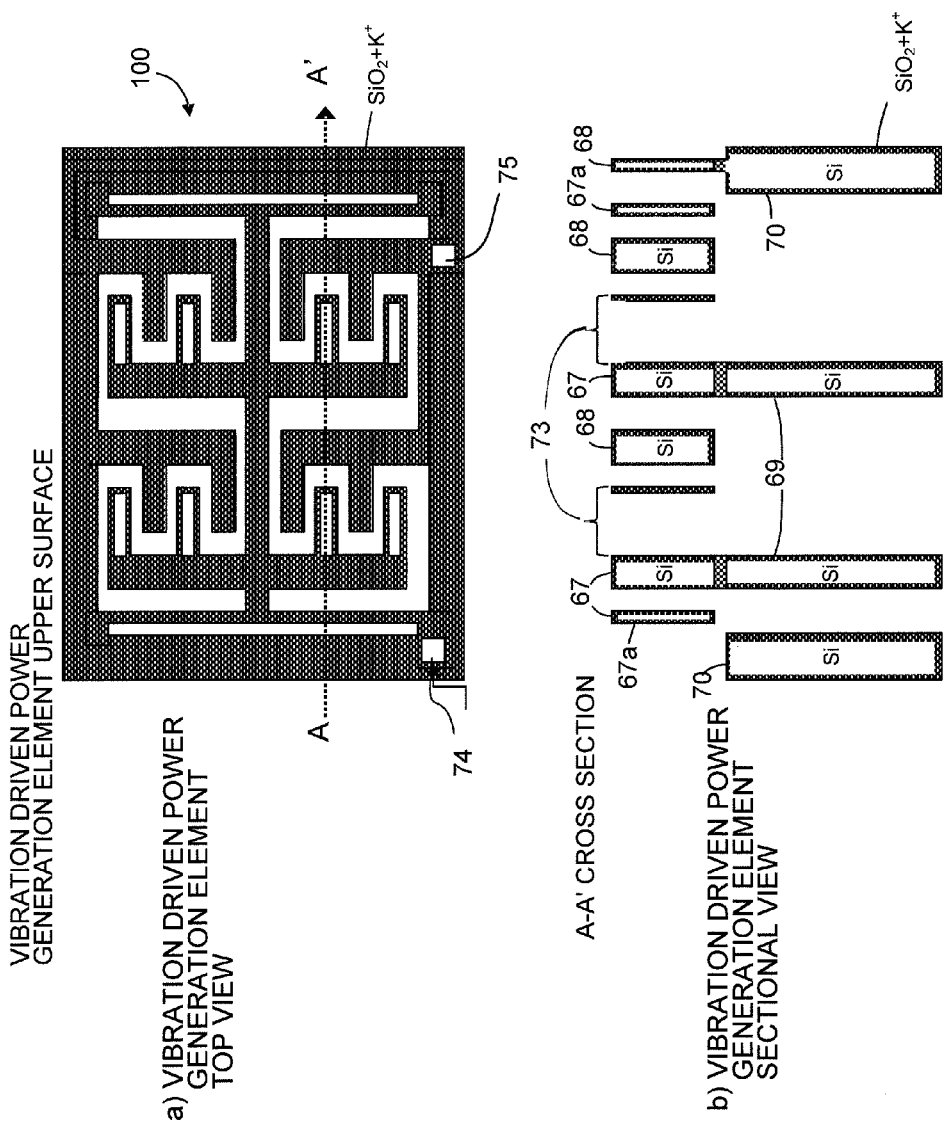
FIG. 3L is a figure for explanation of a process (Process #2-14) in which the electrode output pads of the movable comb tooth electrode and the fixed comb tooth electrode of the second embodiment of the vibration driven power generation element according to the present invention are formed: while the vibration driven power generation element that is shown in this figure is the final form of the second embodiment, a further process that is explained is additionally performed in a variant embodiment.

With the vibration driven power generation element in the state shown in FIG. 3K, layers made from three layers of Cr, Ni, and Au are formed on both the movable comb tooth electrode connection pad 74 and the fixed comb tooth electrode connection pad 75, in order to enable wire bonding to the connection pad portions 71 and 72 (refer to FIG. 3L). The Cr layers adhere to the Si portions, and wire bonding can be adhered to the Au layers.

By the above processes, the manufacture of this comb tooth electrode construction 1 that is the second embodiment of the vibration driven power generation element 100 according to the present invention is completed. Since, in this second embodiment as well, this comb tooth electrodes of the vibration driven power generation element are three dimensional comb tooth electrodes, accordingly it is possible to make the $SiO_2$ layer on these comb tooth electrodes, in which the alkali ions (i.e. the K+ ions) are included and that functions as an electret, large in area, so that it is possible to make the output of this vibration driven power generation element large.

It should be understood that while, in FIGS. 3K and 3L, portions of the movable comb tooth electrode 67 are designated by the reference symbols 67a, these portions 67a are elastic support portions that support the movable comb tooth electrode 67.

Furthermore, movable comb-tooth electrode connection pad 74 are formed upon portions of these movable comb tooth electrode support portions 67a.

A First Variant of the First Embodiment

With the movable comb tooth electrode comb tooth portions 33 of the first embodiment, the rigidity is high as compared with the movable comb tooth electrode comb tooth portions 75 of the second embodiment, since an $SiO_2$ layer is also formed on their bottom portions, but there is a possibility that they may suffer deformation, because the upper surface side of the vibration driven power generation element is in the open state. It is possible to enhance the strength by removing the device Si portion at the movable comb tooth electrode comb tooth portions 33 as explained in Process #1-15 (FIG. 10), and by injecting an insulation material into the hollowed out portions of the comb tooth portions 33. A construction in which insulating material is injected into the comb tooth portions 33 of the first embodiment so that their rigidity is increased, and a method for manufacturing this construction, will now be explained with reference to FIGS. 4A and 4B.

A stencil mask 80 having an opening portion 81 that matches the opening portions 34 (refer to FIG. 1M) of the movable comb tooth electrode comb tooth portions 33 of the first embodiment shown in FIG. 1O (Process #1-15A1) or in FIG. 1P (Process #1-15A2) is prepared, and is installed to the upper surface of the vibration driven power generation element 1. Actually, as previously described, a large number of these vibration driven power generation elements are made in the form of a wafer, and this wafer is put into a tray having sufficient depth for all of these vibration driven power generation elements in wafer form to be dipped into the resist. A negative type resist is filled into the tray, and this negative type resist is also injected into the cavity portions of the comb tooth portions 33 (Process #1-15A1). In this state, the assembly is exposed from above the stencil mask, and then the resist that has been injected into the comb tooth portions 33 is hardened by the application of heat or the like. Thereafter the vibration driven power generation element in wafer form is washed (Process #1-15A2). The resist 83 that has been hardened in the hollowed out portions of the comb tooth portions 33 remains, and, by doing this, a movable comb tooth electrode comb tooth portion 84 is formed whose rigidity has been enhanced (refer to FIG. 4B).

A Second Variant of the First Embodiment

This variant embodiment is also a reinforcement construction that imparts greater rigidity to the movable comb tooth electrode comb tooth portions of the first embodiment, and a method for manufacture thereof. While a similar stencil mask is employed to the one used in the first variant embodiment described above, resist is not used, and accordingly no exposure and development are performed. As shown in FIG. 5A and illustrated in FIG. 1O (Process #1-15B1) or in FIG. 1P (Process #1-15B2), a stencil mask 80 is prepared having opening portions 81 that match the opening portions 34 (refer to FIG. 1M) of the movable comb tooth electrode comb tooth portions 33 of the first embodiment, and this stencil mask is installed upon the upper surface of the vibration driven power generation element 1. Through these opening portions 81 of the stencil mask 80, thermoplastic resin 85 in powder form is filled into the comb tooth portions 33 of the movable comb tooth electrode, that are formed as hollowed out (Process #1-15B1).

Subsequently, heat is applied to all of the vibration driven power generation elements in wafer form, and the thermoplastic resin 85 at least partially melts and subsequently cools, so that, as a result, movable comb tooth electrode comb tooth portions 88 are formed whose interiors are filled with structure of this thermoplastic resin (Process #1-15B2).

A Variant of the Second Embodiment

Figure 6B:
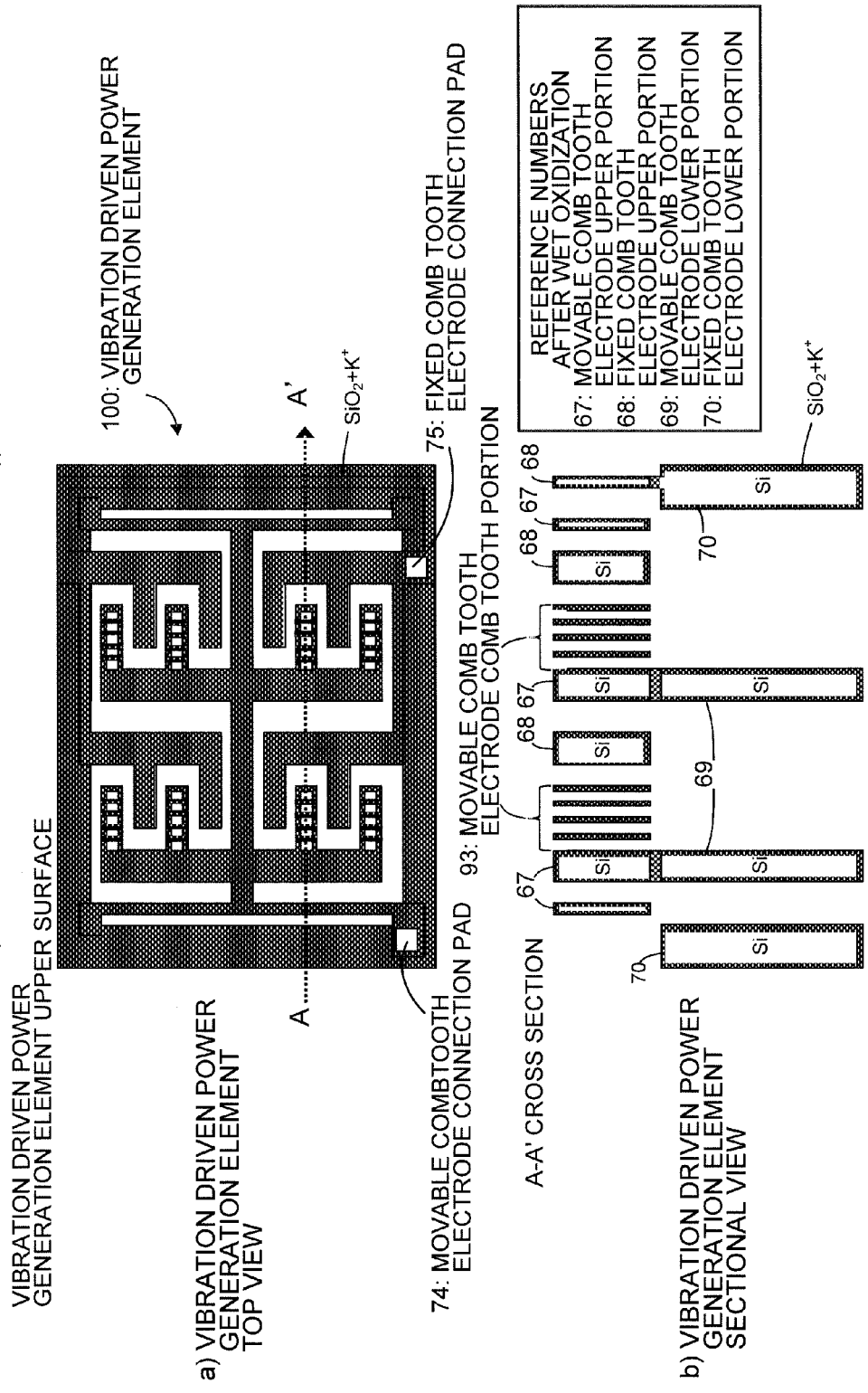
FIG. 6B is a figure showing the shape of the final state of the movable comb tooth electrode in this variant of the second embodiment that has been formed by the resist pattern of FIG. 6A (Process #2-14A, that is a variant of Process #2-14)

This variant embodiment is a construction in which the rigidity of the comb tooth portions 75 (refer to FIGS. 3K and 3L) of the movable comb tooth electrode in the second embodiment described above is enhanced, and a method for manufacturing that construction. While each of the comb teeth of the comb tooth portions 75 shown in FIG. 3K or FIG. 3L has a hollowed out structure, in this variant embodiment, a construction in which the rigidity of these hollowed out portions is enhanced is formed in manufacturing process. In concrete terms, as shown in FIG. 6B (the movable comb tooth electrode comb tooth portions 93), for each of the comb teeth in the top view a) of FIG. 3K or FIG. 3L, between the surfaces that define its two mutually opposing long sides, one or more struts are formed so as to join these surfaces together. While, in the example shown in FIG. 6B, a plurality of pillar-shaped structures are formed in parallel between the two mutually opposing surfaces, it would also be acceptable to arrange to form truss-shaped structures in the hollowed out portions of the comb tooth portions 75.

In order to form the movable comb tooth electrode comb tooth portions shown in FIG. 6B, the resist patterns 55, 56 for movable comb tooth electrode formation in the above described Process #2-5A (refer to FIG. 3C) are made as resist patterns 91, 92 for movable comb tooth electrode formation, as shown in FIG. 6A. By implementing the manufacturing process of the second embodiment described above while using resist patterns 91, 92 of this type, it is possible to manufacture a vibration driven power generation element (Process #2-14A) that is equipped with movable comb tooth electrode comb tooth portions 93 in the final state shown in FIG. 6B.

It should be understood that, using the previously described wet oxidization process explained above with reference to FIG. 2, an $SiO_2$ layer in which K+ ions are injected is also formed upon the internal structures of the comb tooth portions 93 of the movable comb tooth electrodes that are manufactured in this manner. Furthermore, the hollowed out portions of the comb tooth portions 93 other than their structural components are filled with air, nitrogen, or some other insulating gas. Alternatively, it would also be acceptable to arrange to fill them with some insulating substance, such as explained with reference to the variant of the first embodiment described above.

Formation of a Protective Layer Over the Electret Electrodes

Figure 8:
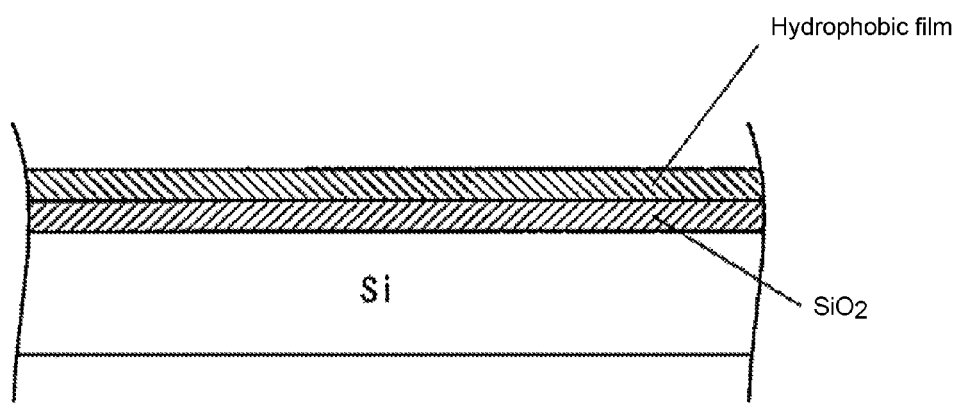
FIG. 8 is a figure for explanation of the formation of a protective layer over the electret electrodes.

While, by injecting K+ ions, $SiO_2$ layers were formed upon the comb tooth electrodes of the vibration driven power generation elements that were manufactured in the first and second embodiments and their variants described above, when these comb tooth electrodes are exposed to air for a long time period, the K+ ions react with the moisture in the air and are gradually neutralized, so that the function of the electrodes as electrets gradually deteriorates. In order to prevent this type of neutralization of the K+ ions, as shown in FIG. 8, it is desirable further to cover the surface of the $SiO_2$ layer with a hydrophobic film layer.

For this type of hydrophobic film layer, it would be acceptable to employ a chemically adsorbent monomolecular layer such as, for example, described in Japanese Laid-Open Patent Publication 2008-110436. Moreover, it is also possible to form a chemically adsorbent monomolecular layer simply and easily by using, on top of the $SiO_2$ layer, a substance whose main components are, for example, a fluorocarbon groups, a hydrocarbon groups, and an alkoxysilyl groups.

A plurality of vibration driven power generation elements formed as a wafer shaped mass is loaded into a chamber, and a vapor of a substance such as described above that is capable of forming a chemically adsorbent monomolecular layer is introduced into the chamber. And, when the $SiO_2$ layer is exposed to this vapor, a chemically adsorbent monomolecular layer is created upon its surface. Since this chemically adsorbent monomolecular layer is formed by the vapor of the substance described above, accordingly a chemically adsorbent monomolecular layer is also created upon the interiors of the hollowed out structures of the movable comb tooth electrodes of the vibration driven power generation element according to the present invention, so that it is possible to prevent neutralization of the K+ ions.

As substances for constituting the main components for forming the fluorocarbon group, the hydrocarbon group, and the alkoxysilyl group of the above described chemically adsorbent monomolecular layer, there may be cited $CF_3(CF_2)_n(CH_2)2Si(OA)_3$, $[CF_3(CF_2)_n(CH_2)_2]2Si(OA)_2$, or $[CF_3(CF_2)_n(CH_2)_2]3SiOA$ (where n is an integer, and A is a short-chain alkyl group such as a methyl group, an ethyl group, a propyl group or the like). In concrete terms, $CF_3CH_2O(CH_2)15Si(OCH_3)3$, $CF_3(CH_2)2Si(CH_3)_2(CH_2)15Si(OCH_3)_3$, or the like may be suggested.

Summary of the Operation of a Vibration Driven Power Generation Element

The operation of a vibration driven power generation element 100 that incorporates electret electrodes according to the present invention will now be explained in a simple manner with reference to FIG. 7. It should be understood that FIG. 7 is based upon the first embodiment described above (refer to FIG. 1P), and in this figure the same reference numbers are employed for portions that are the same as in the first embodiment.

As has been explained above, the vibration driven power generation element 100 according to the present invention includes a fixed three dimensional comb tooth electrode 25 and a movable three dimensional comb tooth electrode 24 that opposes and is interleaved with this fixed comb tooth electrode 25, and each of the comb teeth of the comb tooth portions 33 of this movable three dimensional comb tooth electrode 24 is either formed as hollowed out, or an insulating substance is filled into this hollowed out portion, with an $SiO_2$ layer into which alkali ions such as K+ ions or the like are injected being formed upon the outer surface of each comb tooth. This $SiO_2$ layer into which alkali ions have been injected functions as an electret. Or since, if the comb teeth are hollowed out, it is considered to be acceptable for an insulating substance consisting of air or nitrogen or some other insulating gas to be introduced thereinto, accordingly it may be said in general that, with the vibration driven power generation element 100 according to the present invention, a movable three dimensional comb tooth electrode is provided having an $SiO_2$ layer formed upon its outer surface that endows it with the function of an electret, and a structure in which an insulating substance is filled into its interior.

Moreover since even if, as in the variant of the second embodiment described above, structural bodies for reinforcement are provided in the hollow portions of the comb tooth portions 73 of the movable comb tooth electrode 67, with electrically conductive Si remaining in the interior of these structural bodies and $SiO_2$ layers being provided on the surfaces of these structural bodies due to those surfaces having been oxidized by the manufacturing process explained above, since this electrically conductive Si is electrically insulated, accordingly no problem will ensue even if this structure as well is considered to be a portion of the movable comb tooth electrode 67 that is endowed with the function of an insulating mass or an electret electrode. Furthermore, since it would also be acceptable not to fill any insulating gas into the comb tooth portions, but instead to exhaust the vibration driven power generation element so that these comb tooth portions are in the vacuum state, accordingly in this specification, for the sake of convenience, vacuum is considered as being one type of insulating material for filling the comb tooth portions.

With regard to the filling of the insulating substance into the interiors of the comb teeth in this manner, the electric force lines that are generated by the electric charges set up on the outer surfaces of the comb teeth of the movable comb tooth electrode (here, K+ ions or the like) are generated in the directions away from the electric charges in a spatially isotropic manner if the surrounding matter consists of a uniform insulating substance, but, if an electrically conductive body is present near the electric charges, then the electric force lines are collected together towards that electrically conductive body.

With the movable comb tooth electrode of the vibration driven power generation element according to the present invention, in the neighborhood of the comb teeth that have become an electret, the Si of the movable comb tooth electrode that is electrically conductive is removed, and an insulating material is filled thereinto instead. Furthermore, in the case of the vibration driven power generation element according to the present invention, the interior of the fixed comb tooth electrode is manufactured with Si that is doped so as to be electrically conductive. Accordingly, when the movable comb tooth electrode 24 is interleaved with the fixed comb tooth electrode 25 as shown in FIG. 7, the electric force lines of the electret of the movable comb tooth electrode come to be oriented toward this fixed comb tooth electrode. And, the more deeply the movable comb tooth electrode 24 is interleaved into the fixed comb tooth electrode 25, the more of the electric force lines generated by the movable comb tooth electrode 24 come to be oriented toward the fixed comb tooth electrode 25.

To put this in another manner, the more deeply the movable comb tooth electrode 24 is interleaved into the fixed comb tooth electrode 25, the more negative electric charges come to be generated in the Si portions in the interior of the fixed comb tooth electrode. Accordingly, when the relative position of the movable comb tooth electrode 24 and the fixed comb tooth electrode 25 changes, the amount of negative electric charge generated in the Si portions in the interior of the fixed comb tooth electrode changes, and an electrical current flows due to this change of relative position, so that power generation comes to be performed.

FIG. 7 shows a case in which the vibration driven power generation element 100 is used as a voltage output element. An output resistor 200 is connected between the movable comb tooth electrode connection pad 34 and the fixed comb tooth electrode connection pad 35, and the voltage between the two ends of this output resistor 200 is outputted as the output voltage of the vibration driven power generation element 100. It should be understood that if the output is to be used as a current, then, for example, instead of the output resistor 200, a rectification circuit is connected, and a capacitor is used to accumulate the DC current after rectification.

When vibration is applied from the exterior to this vibration driven power generation element 100, the movable comb tooth electrode 24 that is supported by the movable comb tooth electrode support portion 24a (that is elastic) is not easily shifted by this external vibration due to the inertia of the anchor portions 26 that is provided at its lower portion, and accordingly the support portion 24a flexes and the movable comb tooth electrode 24 moves to and fro. In other words, the relative position of the movable comb tooth electrode 24 and the fixed comb tooth electrode 25 changes.

As previously described, the $SiO_2$ layer upon the surface of the movable comb tooth electrode 24 has become an electret layer in which K+ ions are included. Moreover, as previously described, the interior of the fixed comb tooth electrode 25 is made of Si that is doped with, for example, phosphorus or the like so as to be electrically continuous. When the relative position of the movable comb tooth electrode 24 and the fixed comb tooth electrode 25 changes, the area of the Si portion internal to the fixed comb tooth electrode 25 that confronts the movable comb tooth electrode 24 changes, so that the amount of electric charge that is induced in this Si portion changes. Due to this, a current that corresponds to the change in the relative position of the movable comb tooth electrode 24 and the fixed comb tooth electrode 25 flows to the output resistor 200, so that the voltage that is generated across this resistor 200 also changes.

It should be understood that while, in the embodiments described above, examples have been explained that employ K+ ions as the ions for forming their electret electrodes, it would also be possible to employ a layered electret construction according to the present invention in which positive ions of some other type are employed, instead of K+ ions. However, it is desirable to employ ions of some alkali element, since, if they are made into an aqueous solution, they can be ionized simply and easily by the wet oxidization process explained above with reference to FIG. 2.

As has been explained above, the method for manufacturing a vibration driven power generation element according to the present invention may be summarized as follows, for both the first and the second embodiments.

1) The First Process

An SOI wafer is prepared including: a substrate Si layer; an $SiO_2$ insulation layer provided over that substrate Si layer; and a device Si layer whose resistance has been lowered by doping, provided over that $SiO_2$ insulation layer (refer to FIG. 1A).

2) The Second Process

On the device Si layer, there are formed: an upper portion of a movable comb tooth electrode that includes movable comb tooth electrode comb teeth; and an upper portion of a fixed comb tooth electrode that includes fixed comb tooth electrode comb teeth (refer to FIGS. 1B through 1G, and FIGS. 3A, 3B and 3E).

3) The Third Process

On the substrate Si layer, there are formed: a lower portion of the movable comb tooth electrode that includes an anchor portion of the movable comb tooth electrode; and a lower portion of the fixed comb tooth electrode that includes a support portion of the fixed comb tooth electrode (refer to FIGS. 1H through 1J, and FIGS. 3F through 3H).

4) The Fourth Process

Hollowed out portions are formed in the interiors of the comb tooth electrode comb teeth portions (refer to FIGS. 1M and 1N, and FIGS. 3C and 3D).

5) The Fifth Process

Before the fourth process, an $SiO_2$ layer including alkali ions is formed on the portions of the surfaces that are exposed of both of the Si layers (the device Si layer and the substrate Si layer) of the vibration driven power generation element (refer to FIGS. 1L and 3J, and FIG. 2).

6) The Sixth Process

A movable comb tooth electrode connection pad and a fixed comb tooth electrode connection pad are formed for taking out the output of the vibration driven power generation element (refer to FIGS. 1B through 1G, FIGS. 1N through 1P, and FIGS. 3E, 3K, and 3L). While the order of the processes for formation by wet oxidization of the $SiO_2$ layer including alkali ions is different in the first and the second embodiments, in general, the broad separation into the abovementioned processes may be performed.

As described above, with the present invention, it is possible to manufacture a generator having high output by using comb tooth electrodes having an electret layer construction according to the present invention. Moreover, it is possible to manufacture a compact generator having high output by forming the electret layer according to the present invention upon the surfaces of three-dimensional comb tooth electrodes.

It should be understood that the vibration driven power generation element according to the present invention may be applied to devices of various kinds. For example it may be applied as a transducer for a microphone, a compact speaker, or the like, or as a power generation element for a watch.

The above explanation only describes embodiments of the present invention by way of example, and the present invention is not to be considered as being limited to these embodiments and variant embodiments. For a person skilled in the art, it would be possible to implement various alterations in the details of any embodiment, without departing from the principle of the present invention.

The invention claimed is:

1. A vibration driven power generation element, comprising:
   a three dimensionally shaped movable comb tooth electrode having a plurality of comb teeth, wherein the plurality of comb teeth each includes an interior filled with insulating material;
   an electret electrode $SiO_2$ layer including alkali ions, wherein the electret electrode $SiO_2$ layer is arranged upon an outer surface of each of the plurality of comb teeth of the three dimensionally shaped moveable comb tooth; and
   a fixed type comb tooth electrode having a plurality of comb teeth, wherein the plurality of comb teeth include doped Si interiors so as to have low electrical resistance, the fixed type comb tooth electrode being arranged opposed to and interleaved with the three dimensionally shaped moveable comb tooth electrode.

2. A vibration driven power generation element according to claim 1, wherein the alkali ions are K+ ions or Na+ ions.

3. A vibration driven power generation element according to claim 1, wherein the insulating material in the interiors of the comb teeth of the three dimensionally shaped movable comb tooth electrode is made from thermoplastic resin.

4. A vibration driven power generation element according to claim 1, wherein the insulating material in the interiors of the comb teeth of the three dimensionally shaped movable comb tooth electrode is an insulating gas.

5. A vibration driven power generation element according to claim 1, wherein the insulating material in a hollowed out portion in each of the interior of the plurality of comb teeth of the three dimensionally shaped movable comb tooth electrode is an insulating structure and/or an insulating gas, and the insulating structure has a structure that reinforces rigidity of each of the comb teeth of the three dimensionally shaped movable comb tooth electrode.

6. A vibration driven power generation element according to claim 1, wherein an anchor portion is provided at a lower portion of the three dimensionally shaped movable comb tooth electrode.

7. A vibration driven power generation element according to claim 6, wherein a layer of a hydrophobic material is formed over a surface of the $SiO_2$ layer.

8. A vibration driven power generation element according to claim 1, wherein a layer of a hydrophobic material is formed over a surface of the $SiO_2$ layer.

9. A method of manufacturing a vibration driven power generation element according to claim 6, comprising:
   a first process of preparing an SOI wafer including: a substrate Si layer; an $SiO_2$ insulation layer provided over the substrate Si layer; and a device Si layer whose resistance has been lowered by doping, provided over that $SiO_2$ insulation layer;
   a second process of forming, on the device Si layer: an upper portion of a movable comb tooth electrode that includes movable comb tooth electrode comb teeth; and an upper portion of a fixed comb tooth electrode that includes fixed comb tooth electrode comb teeth;
   a third process of forming, on the substrate Si layer: a lower portion of the movable comb tooth electrode that includes an anchor portion of the movable comb tooth electrode; and a lower portion of the fixed comb tooth electrode that includes a support portion of the fixed comb tooth electrode;
   a fourth process of forming cavities in the interiors of the comb tooth electrode comb teeth portions; and
   a fifth process of, before the fourth process, forming an $SiO_2$ layer including alkali ions on an exposed portion of a surface of an Si layer (the device Si layer and the substrate Si layer) of the vibration driven power generation element.

10. A method of manufacturing a vibration driven power generation element according to claim 9, wherein, in the fifth process, wet oxidization is performed by applying heat to the vibration driven power generation element in an atmosphere of water vapor including alkali ions.

11. A method of manufacturing a vibration driven power generation according to claim 9, wherein the alkali ions are K+ ions or Na+ ions.

12. A method of manufacturing a vibration driven power generation according to claim 10, wherein the alkali ions are K+ ions or Na+ ions.

13. A vibration driven power generation element according to claim 2, wherein the insulating material in the interiors of the comb teeth of the three dimensionally shaped movable comb tooth electrode is made from thermoplastic resin.

14. A vibration driven power generation element according to claim 2, wherein the insulating material in the interiors of the comb teeth of the three dimensionally shaped movable comb tooth electrode is an insulating gas.

15. A vibration driven power generation element according to claim 2, wherein the insulating material in a hollowed out portion in each of the interior of the plurality of comb teeth of the three dimensionally shaped movable comb tooth electrode is an insulating structure and/or an insulating gas, and the insulating structure has a structure that reinforces rigidity of each of the comb teeth of the three dimensionally shaped movable comb tooth electrode.

16. A vibration driven power generation element according to claim 2, wherein an anchor portion is provided at a lower portion of the three dimensionally shaped movable comb tooth electrode.

17. A vibration driven power generation element according to claim 16, wherein a layer of a hydrophobic material is formed over a surface of the $SiO_2$ layer.

18. A vibration driven power generation element according to claim 2, wherein a layer of a hydrophobic material is formed over a surface of the $SiO_2$ layer.

19. A method of manufacturing a vibration driven power generation element according to claim 16, comprising:
   a first process of preparing an SOI wafer including: a substrate Si layer; an $SiO_2$ insulation layer provided over the substrate Si layer; and a device Si layer whose resistance has been lowered by doping, provided over that $SiO_2$ insulation layer;
   a second process of forming, on the device Si layer: an upper portion of a movable comb tooth electrode that includes movable comb tooth electrode comb teeth; and an upper portion of a fixed comb tooth electrode that includes fixed comb tooth electrode comb teeth;
   a third process of forming, on the substrate Si layer: a lower portion of the movable comb tooth electrode that includes an anchor portion of the movable comb tooth electrode; and a lower portion of the fixed comb tooth electrode that includes a support portion of the fixed comb tooth electrode;
   a fourth process of forming cavities in the interiors of the comb tooth electrode comb teeth portions; and
   a fifth process of, before the fourth process, forming an $SiO_2$ layer including alkali ions on an exposed portion of a surface of an Si layer (the device Si layer and the substrate Si layer) of the vibration driven power generation element.

20. A method of manufacturing a vibration driven power generation element according to claim 19, wherein, in the fifth process, wet oxidization is performed by applying heat to the vibration driven power generation element in an atmosphere of water vapor including alkali ions.

21. A method of manufacturing a vibration driven power generation according to claim 19, wherein the alkali ions are K+ ions or Na+ ions.

22. A method of manufacturing a vibration driven power generation according to claim 20, wherein the alkali ions are K+ ions or Na+ ions.

* * * * *